(12) United States Patent
Panella et al.

(10) Patent No.: US 8,562,358 B2
(45) Date of Patent: *Oct. 22, 2013

(54) PATCH PANEL ASSEMBLY FOR USE WITH DATA NETWORKS

(75) Inventors: Augusto P. Panella, Naperville, IL (US); Elliot A. Baines, Naperville, IL (US); Jeng-De Lin, Yorkville, IL (US)

(73) Assignee: Molex Incorporated, Lisle, IL (US)

( * ) Notice: Subject to any disclaimer, the term of this patent is extended or adjusted under 35 U.S.C. 154(b) by 179 days.

This patent is subject to a terminal disclaimer.

(21) Appl. No.: 13/123,030

(22) PCT Filed: Oct. 7, 2009

(86) PCT No.: PCT/US2009/059805
§ 371 (c)(1),
(2), (4) Date: Jun. 28, 2011

(87) PCT Pub. No.: WO2010/042591
PCT Pub. Date: Apr. 15, 2010

(65) Prior Publication Data
US 2011/0256742 A1 Oct. 20, 2011

Related U.S. Application Data

(60) Provisional application No. 61/103,532, filed on Oct. 7, 2008, provisional application No. 61/103,487, filed on Oct. 7, 2008.

(51) Int. Cl.
*H01R 29/00* (2006.01)
(52) U.S. Cl.
USPC .......................... 439/49; 439/676; 439/607.05

(58) Field of Classification Search
USPC .............................. 439/49, 489, 676, 607.054
See application file for complete search history.

(56) References Cited

U.S. PATENT DOCUMENTS

| 6,305,987 B1* | 10/2001 | Crane et al. .................... 439/676 |
| 7,207,846 B2 | 4/2007 | Caveney et al. |
| 8,251,707 B2* | 8/2012 | Panella et al. .................... 439/49 |
| 2006/0223366 A1 | 10/2006 | Murayama et al. |
| 2011/0256738 A1* | 10/2011 | Panella et al. .................... 439/49 |

OTHER PUBLICATIONS

International Search Report and Written Opinion for PCT/US2009/059805, Nov. 17, 2009.

* cited by examiner

*Primary Examiner* — Truc Nguyen
(74) *Attorney, Agent, or Firm* — Timothy M. Morella

(57) ABSTRACT

A patch panel (100) for use with infrastructure management systems that utilizes a plurality of cables interconnected to end-user devices and work area outlets, and integrated circuits to monitor the status of these end-user devices and outlets includes a pair of circuit boards. A plurality of connective jacks (31) are mounted on the first (36) of the two circuit boards, and are interconnected to other network devices. Wires from the jacks extend to and connect with network devices and the first circuit board has a plurality of first integrated circuits (45) mounted thereon which monitor the status of the network devices connected to the jacks. The second circuit board (49) is spaced apart from the first circuit board and it includes a plurality of second integrated circuits (52) that convey the status information obtained from the network work area outlets on the network to network devices, such as switches and scanners of the network (104).

20 Claims, 19 Drawing Sheets

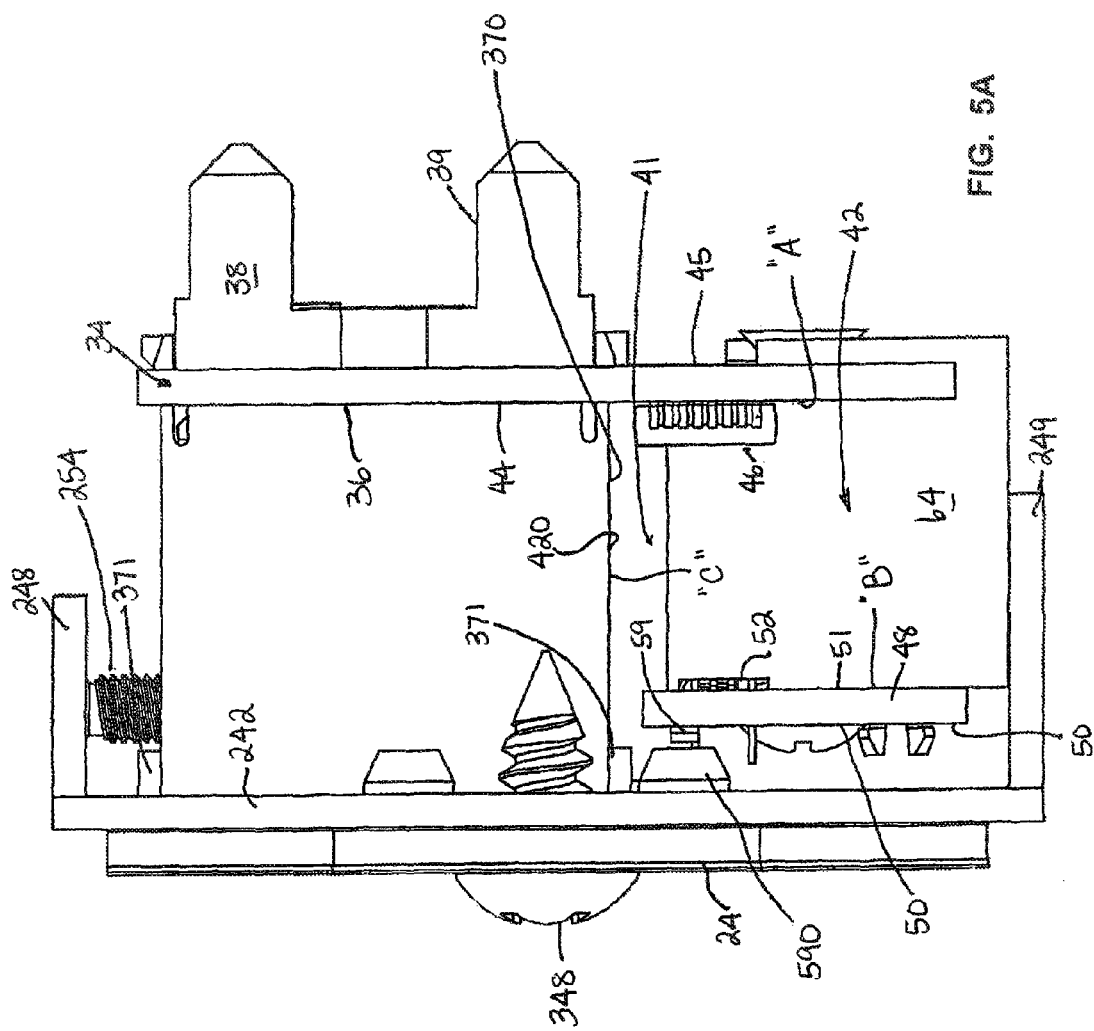

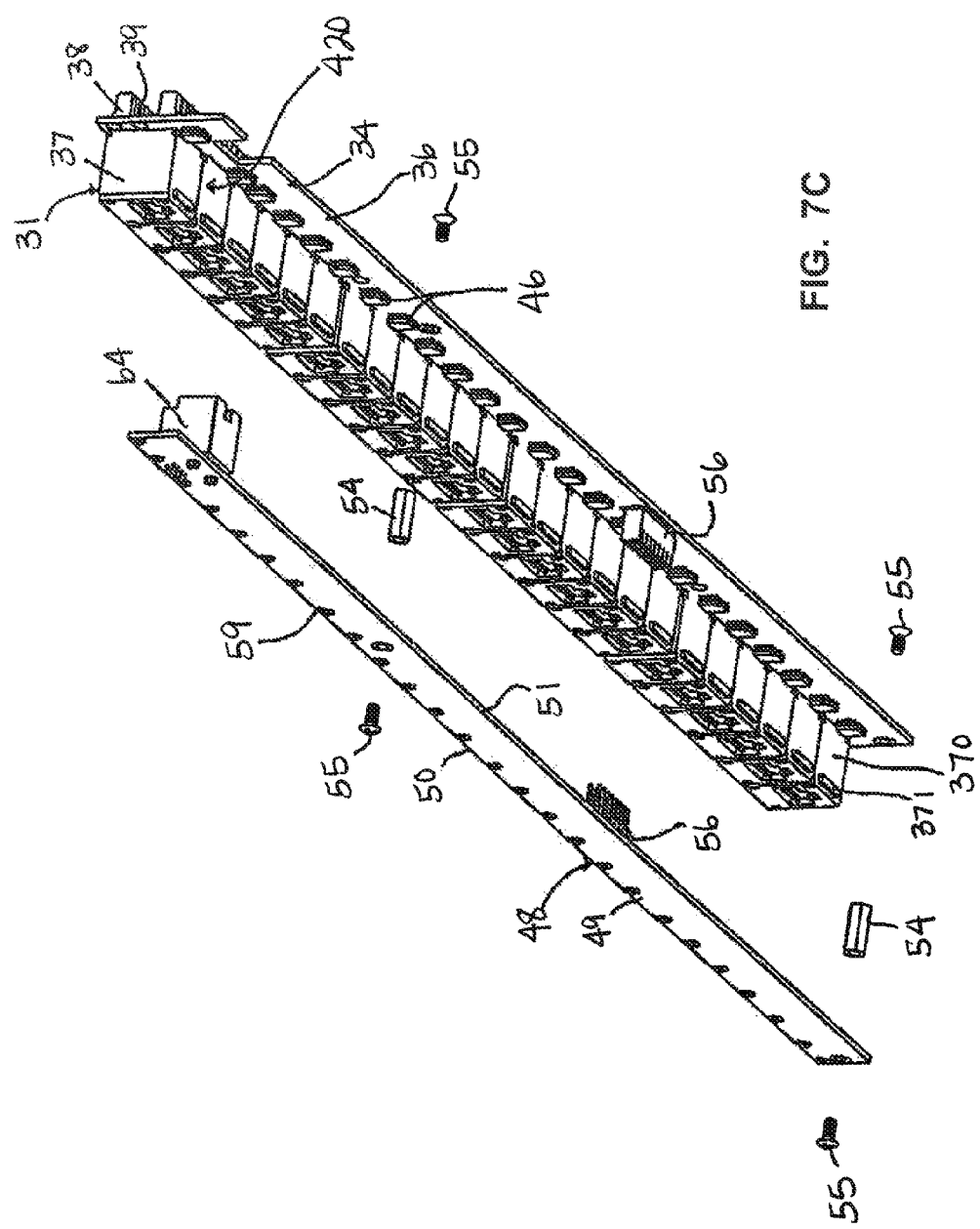

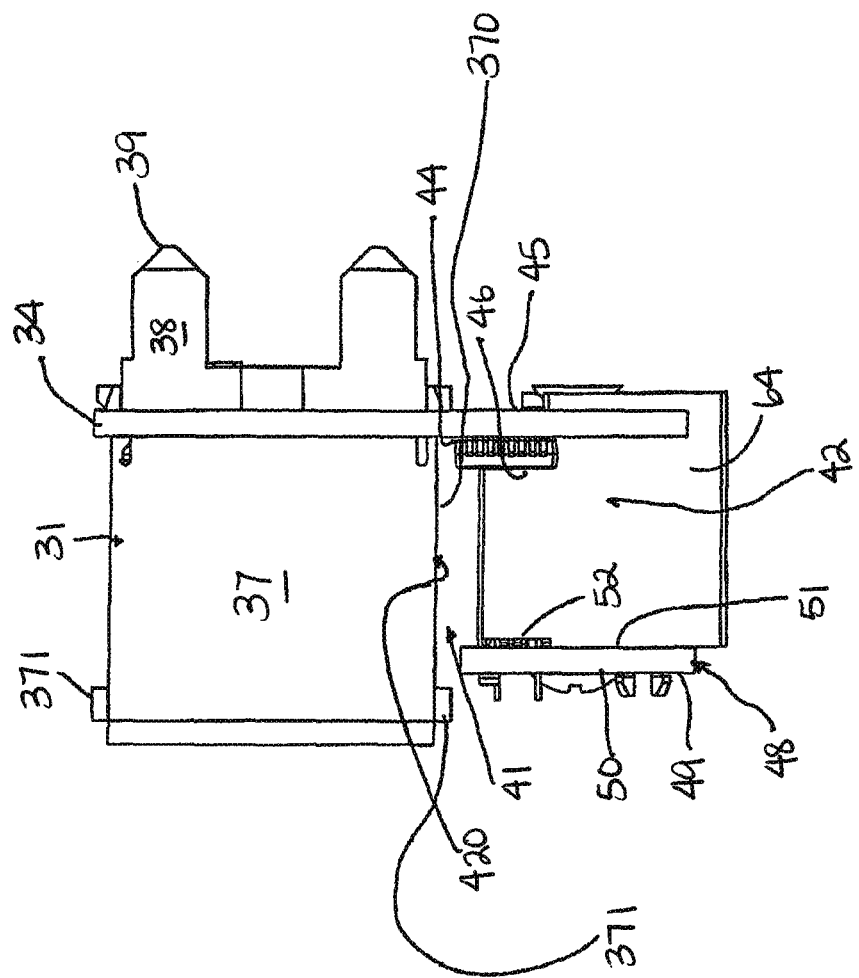

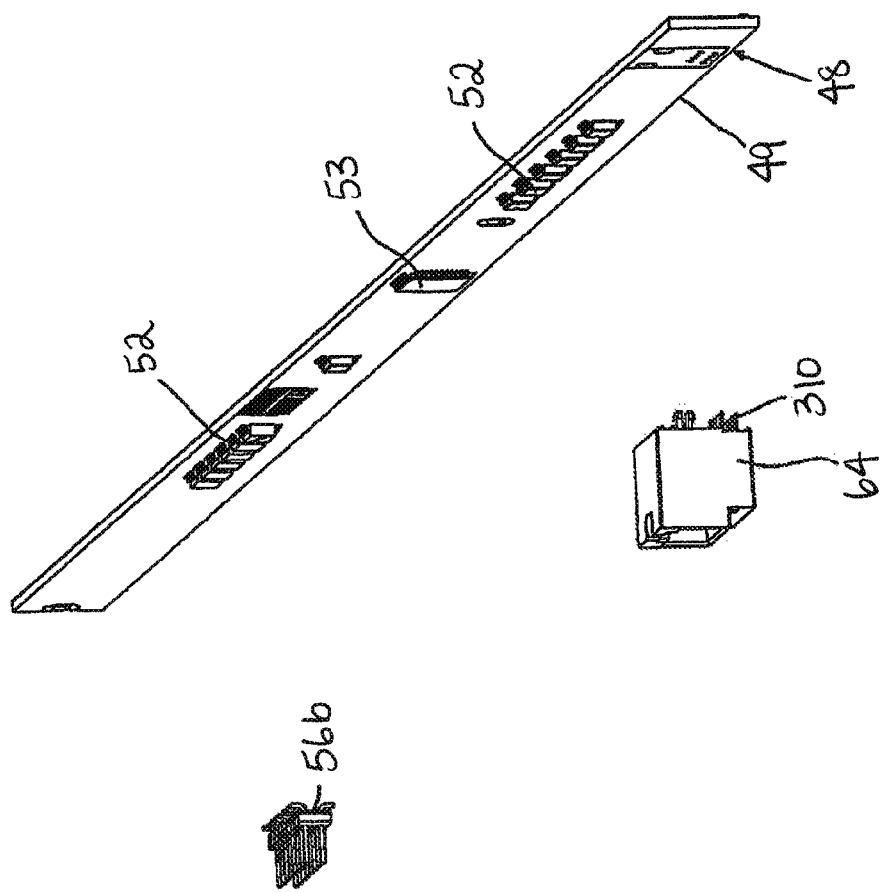

PATCH PANEL ASSEMBLY FOR USE WITH DATA NETWORKS

CROSS-REFERENCES TO RELATED APPLICATIONS

The present invention claims the priority of previously-filed U.S. Provisional Application Nos. 61/103,487 and 61/103,532, both of which were filed on 7 Oct. 2008. The contents of each of these previously-filed Applications are incorporated by reference herein in their entireties.

BACKGROUND OF THE INVENTION

The present invention relates generally to infrastructure management systems and, more particularly, to systems, assemblies and components that are useful in managing infrastructure assets.

Computing networks that exist within large organizations consist of two types of devices that must be inter-connected to form a usable data network—these assets are generally classified as end-user devices and networking devices. Examples of end-user devices include personal computers (PC), voice-over-internet protocol (VoIP) phones, and network printers. A typical Local Area Network (LAN) for a large-scale enterprise may include thousands of end-user devices deployed throughout a campus in individual offices or in common areas accessible to the end-users. In addition, data networks also typically include network devices such as switches and routers that form the core of the network. These networking devices serve to route data packets between devices on the LAN, or between the LAN and the larger corporate Wide Area Network (WAN), or to the internet. These network devices are typically located in a centralized room or rooms, known as wiring closets and data centers.

Information technology (IT) departments for such organizations need to know the status of network connectivity of each device, the physical location of the devices, and need to identify the source and location of any errors or problems as quickly as possible. Tracking of device assets is a key concern—for example in monitoring the presence of devices on the network for loss-prevention purposes, or to ensure devices are properly physically positioned in offices or on floors where end users can best utilize them, while maintaining proper connectivity of the network. Currently, a unified system for tracking devices connected to the network and monitoring the status of the physical connectivity of the network does not exist.

The Open System Infrastructure (OSI) model describes layered communications in a computer network. "Layer 1," the physical layer, defines all of the electrical and physical specifications for devices connecting to a network. For example, the Institute of Electrical and Electronics Engineers (IEEE) Standard 802.3 defines the standards for wired Ethernet, which is commonly used in computing networks. As part of the IEEE 802.3 Specification, the physical layer of an Ethernet network is defined. Examples of physical layer elements as defined in IEEE 802.3 include electrical voltages and signal protocols, cable requirements, and termination resistance.

To connect the end-user devices to the network devices requires that the network devices in the wiring closet or data center be connected to end-user devices as needed for the particular requirements of the users of the LAN. Each path from switch to end-user device is known as a channel. The typical deployment of physical layer connectivity for a LAN channel consists of a patch cord between a switch port and a patch panel port; a length of multi-pair cable from the rear of the patch panel port to a work area outlet port at the end-user's office, and a patch cord from the outlet to the end-user's device. Each of these ports are modular jacks designed to industry-standard specifications so as to accept mating patch plugs.

The management of the patch cords in the telecom room or at the work area outlet can present issues to the IT management group. Each time an employee is hired, leaves the organization or changes location, it is inevitable that patch cables must be connected and disconnected. A wiring closet typically contains numerous switches, patch panels and patch cords, numbering at times in the hundreds and higher. The patch cords are often snaked around one another, making the operations of adding, removing, or tracing the patch cords difficult and time-consuming. When a new patch cable has to be connected within the system, or a patch cable has to be moved, a technician enters the wiring closet and must locate the appropriate cable among hundreds, or perhaps thousands, of patch cords. The technician then must locate the appropriate patch panel and the appropriate ports on those patch panels. Finally, the technician must connect the patch cord to the correct ports on the patch panels and verify that the connection has been done correctly. Once the patch cord is connected, there is not an easy, cost and time-effective way to determine if the cord was connected to the correct port(s). For example, the technician may have to go to the network port or end-user device located at a remote location, such as an individual's office, to determine if the patch cable was correctly inserted and that network connectivity is available at the asset. Therefore, connecting and transferring networks assets is labor-intensive.

Additionally, the IT department does not have an efficient way to determine the exact location of network problems which may be attributed to the physical layer. For example, the problem may be located in the switch closet if a patch cord was not properly connected, or the problem may exist in the wiring from the switch closet to the network asset. The IT department does not currently have an efficient way to determine if network problems exist in the physical network wiring. Accordingly, a need exists for a better information management system that includes components that simplify the process for identifying assets in order, at a minimum, to reduce the time required to move and check assets on a network.

In order to centralize certain aspects of the data communication network, it becomes desirable to locate the patch panels at one location, such as in the aforementioned switch closet. Space often comes at a premium and it is desirable to have the patch panels located in the closet. However, because switches and other components are also located in the switch closet, as components that are separate from the patch panels, space within the switch closet is at a premium. The patch panels utilize electronic components apart from their connectors and these components such as integrated circuits and the like, are sensitive and susceptible to possible damage during assembly and installation of the patch panels. Additionally, because such patch panels typically utilize jacks for their connectors and these jacks have termination portions that typically utilize insulation displacement technology terminals, the overall patch panels may be subject to impact loads during assembly if the IDT termination tool inadvertently slips out of place. Accordingly, a need exists for a patch panel assembly that concentrates the upstream and downstream connections and controllers in one location.

The present invention is directed to such a system. We have developed an infrastructure management system that scans selected aspects of a network to reduce overall scanning drive and which provides identifying data that permits a network manager to make internal decisions as to the status of a network, utilizing, in part, a patch panel assembly structure that may be inserted into the data communication network in order to interconnect together a server(s), switches, patch panels and/or other network devices and the work area outlets, wherein the patch panel assembly is compact and incorporates integrated circuits and/or processors for monitoring the status of the network devices without the need for a separate housing. In one sense, the patch panel assembly is provided to interconnect and monitor various connection points of the data network and in this regard, the patch panels may be considered as interface assemblies that are provided in order to interconnect and monitor various connecting points of the network so as to provide the system with the ability to monitor the status and operational conditions of end-user devices connected to the work area outlets of the network, as well as other network devices. These patch panels may take the form of assemblies having panels with a plurality of receptacle connectors that receive and engage mating ends of the patch cords, or cables.

It is desirable to keep the size of these panels down to a minimum due to the large number of patch cords typically utilized in connecting patch panels and switches together. Should part of a patch panel assembly fail, it is desirable to have the junction possess a structure that is compact and integrated so as to lessen the time for replacement or repair, and to facilitate the technician removing the errant portion and inserting a replacement in its place. Moreover, it is desirable to house the integrated circuits, processors and the like in a manner to protect the electronic components of the patch panel. The present invention is therefore directed to a patch panel assembly that can be utilized in patch panels and which facilitates the insertion and replacement of patch panels in a wiring closet.

SUMMARY OF THE INVENTION

Accordingly, it is a general object to provide an improved patch panel assembly for use with a infrastructure management system.

Another object is to provide a patch panel assembly for use with an infrastructure management system in which the patch panel assembly does not increase the overall height of the system components.

A still further object is to provide a patch panel assembly for use in a data transmission network, the network including a plurality of network devices located at discrete locations of the network, the network devices including a server, switches, patch panels and the like, and end-user devices connected to the work area outlets, the patch panel assembly being interconnected to the network devices via network cables.

Yet another object is to provide a patch panel assembly for use in a infrastructure management system, the patch panel assembly acting as a junction for interconnecting together a plurality of work area outlets of the network to other network devices, the patch panel assembly including a plurality of connectors, the panel connectors receiving network cables that extend between the patch panel assembly and other patch panels, switches, servers, scanners and the like, the connectors including termination portions for terminating network cables thereto in order to interconnect the patch panel assembly and its connectors to network work area outlets and end-user devices connected thereto, the patch panel assembly further including a plurality of integrated circuits for monitoring the status of the network devices, the patch panel assembly having specific configuration so as to fit into a patch panel rack, or enclosure.

A yet further object is to provide a patch panel assembly as described above, wherein the patch panel assembly includes a primary circuit board, the primary circuit board including a plurality of cable connectors in the form of jacks, disposed thereon and protruding therefrom so as to define an open space adjacent to and underneath the jacks along a face of the primary circuit board, the jacks including a plurality of termination ends extending disposed along another face of the primary circuit board, and a secondary circuit board disposed within the nest and spaced apart from the primary circuit board, which all cooperatively define a protective, hollow nest including electronic elements such as integrated circuits ("ICs") and the like for determining the status of network work area outlets and for identifying jacks of the patch panel, the electronic elements being disposed within the hollow nest and protected from exterior access of the assembly, the nest including a plurality of first and second integrated circuits respectively disposed on the primary and secondary circuit boards, the first integrated circuits being operatively associated with the wire connectors disposed on the primary circuit board for determining the status of end-user devices connected to the work area outlets and the second integrated circuits being operatively associated with the first connectors and visual indicators thereof for identifying the connection ports of the patch panel assembly for connection to network components located on the network.

A still further object is to provide, for use in an electronic data network that monitors the status of various devices interconnected together by way of an electronic network, an interface assembly that includes a plurality of first connectors for connecting to, via network cables, individual end-user located at work area outlets of the network, and at least one second connector for connecting to a scanning device for monitoring the work area outlets and end-user devices attached thereto, the interface assembly including confronting primary and secondary circuit boards, the primary circuit board supporting the first connectors, the first connectors being arranged in side-by-side order and further extending out from one surface of the primary circuit board and defining an open space adjacent to and underneath the first connectors, the secondary circuit board being supported in the space in a confronting relationship to the primary circuit board, the primary and second circuit boards supporting a plurality of integrated circuits for receiving status information from the end-user devices and for reading the status information collected by the first integrated circuits and utilizing that information to operate visual indicators of the interface assembly, surfaces of the primary and secondary circuit boards and the connectors cooperatively defining a protective, hollow nest that partially encloses the ICs in a manner such that they are not exposed on any exterior surfaces of the assembly where they may be susceptible to damage during assembly or installation of the patch panel assembly.

Yet another object is to provide a patch panel assembly that has a structure which facilitates service and/or repair of the patch panel assembly by utilizing the above-mentioned structures and isolating the sets of first and second integrated circuits in a respective fashion on the primary and secondary circuit boards so that each of the two circuit boards contains the integrated circuits necessary to carry out the functions of the components operatively connected to the electronic components supported by the particular circuit board whether it be connectors or visual indicators or the like, thereby facilitating the servicing of the patch panel assembly by isolating failures of the elements onto one or the other circuit boards.

A still additional object is to provide a patch panel assembly of the type immediately discussed above, wherein the primary and secondary circuit boards are interconnected together in a fashion such that the secondary circuit boards may be disconnected from the primary circuit board and replaced or repaired in the field while disconnected, the disconnecting and removal of the secondary circuit board creating access to the primary circuit board.

The present invention accomplishes these and other objects by way of its structure. In a preferred embodiment, a patch panel assembly is provided as part of an overall monitoring system for a data network. The patch panel assembly has a structure that fits into a rack and it includes primary and secondary circuit boards that are spaced apart from each other. The secondary circuit board is smaller than the primary circuit board so that a plurality of connectors may be mounted to the primary circuit board in a fashion such that they project forwardly therefrom. Preferably, the connectors are arranged in side-by-side order and their projection from the primary circuit board creates an open space adjacent to and underneath them in which the secondary circuit board is received. The connectors receive patch cords that may be used to connect the patch panel to work area outlets of the data network, and to one or more network devices in the form of other patch panels, servers, switches, scanners or the like.

The first connectors preferably take the form of jacks, such as RJ-11 or RJ-45 jacks, which may be assembled in conjunction with a face plate so that the receptacle of the jacks define discrete connection ports of the patch panel assembly that receive patch cords or other connecting cables in order to provide an identification of particular connection ports during installation, or updating, of the data network. The termination portions of the jacks are connected to wires of network cables that lead to individual work area outlets so that the status of the work area outlets may be monitored. The jacks have their openings facing forwardly of the patch panel assembly so that they are accessible through a face panel of the patch panel assembly, while the second connector(s) have their openings facing rearwardly of the patch panel assembly so that they are accessible from the rear of the assembly.

The primary and secondary circuit boards are preferably spaced apart from each other by way of standoffs or the like and thereby define a hollow nest of the patch panel assembly defined in part by opposing surfaces of the primary and secondary circuit boards that are located beneath the first connectors. This hollow nest accommodates a plurality of first and second integrated circuits ("ICs"). The first ICs serve to monitor the status of the work area outlets to which the first connectors are connected by way of network cables. Circuitry interconnecting the connectors and the first ICs are resident on the primary circuit board. In order to provide an identification of particular connection ports during installation, or updating, of the data network, visual indicators are provided on the face panel that can be selectively illuminated to display the status of the network work area outlet associated with the indicator.

Similarly, the second ICs serve to read the status information from the first ICs and operate the visual indicators associated with the face plate to display the status of the work area outlets, or to identify selected connection ports on the face plate that lead to selected work area outlets, or connection ports on other patch panel assemblies of the network, as well as communicate with the scanner of the infrastructure management system. The first and second sets of ICs are maintained in isolation from each other, by being respectively placed on the primary and secondary circuit boards so that all of the electronic processing and logic components are separated on the two circuit boards in order to facilitate service and/or repair of the assembly. In instances where one of the electronic elements on the secondary circuit board, such as an IC, LED or the like fails and needs to be replaced, the defective circuit board may be replaced with another one without requiring disassembly of the entire patch panel assembly. Removal of the face plate and one of the covers will permit a technician access to the secondary circuit board, which may be removed and serviced, or replaced. The removal of the face plate, cover and secondary circuit board provides access for a technician to the first set of ICs mounted on the front surface of the primary circuit board in the nest underneath the first connectors, thereby facilitating the access for repair of service of the first set of ICs of the assembly.

The ICs are protected within this hollow nest and are preferably disposed on opposing, or confronting surfaces of the two circuit boards. In this manner, they are not exposed to the exterior or to the metal covers that enclose the assembly, nor are they exposed in an area that may be subject to impact during assembly such as near the termination portions of the patch panel jacks. Additionally, selected surfaces of the jacks, typically the bottom surfaces of the jack housings, will form the top wall of a three-sided the hollow nest, while a cover member will preferably close off the bottom of the hollow nest. In this manner, the ICs and other electronic elements are entirely enclosed within the assembly.

The first set of ICs preferably include logic devices and multiplexers which are operatively connected to the first connectors. These first ICs determine the status of the work area outlets and the network cables as well as combine several input signals into a single output signal. In order to interconnect each of the work area outlets to the first connectors, the first connectors are provided as jacks with termination blocks that lead to terminals in receptacles of the jacks. The receptacles face forward so that each such jack opens along the face panel of the patch panel assembly. In this manner, the connection ports of the patch panel assembly may be connected to other network devices or a server, router, switch or the like. In order to connect to other network devices of the system, such as a scanner, the secondary circuit board may have one or more connectors that face rearwardly, and these connectors extend through openings, or notches, formed in the primary circuit board so as to reduce the spacing between the primary and secondary circuit boards.

The circuits that connect the second set of ICs with the visual indicators are preferably disposed solely on the secondary circuit board which ensures that the secondary circuit board can be individually removed from the patch panel assembly so that the servicing of any aspect of the secondary panel can be easily accomplished in the field. Keeping the second IC circuits solely in place on the secondary circuit board also ensures the shortest path length for each visual indicator circuit, extending between a selected second integrated circuit and its associated visual indicator. Similarly, the circuits that interconnect the first integrated circuits and the first connectors for reading the status of the work area outlets, are also preferably in place only upon the first circuit board. The primary and secondary circuit boards include at least one connector that connects the first and second circuits and first and second IC sets together so that communication through the network may be achieved.

This isolation of the first and second circuit boards and ICs facilitates repair, replacement and/or servicing of the patch panel assembly in the field. If one such patch panel assembly has one or more defective second integrated circuits or a portion of the second circuitry thereupon is defective, the second circuit board can be removed and replaced. Alternatively, the second circuit board can be repaired in the field upon its removal by removing and replacing the defective second IC(s). Removal of the second circuit board opens up the hollow nest and permits access to the first circuit board, the first ICs and first connectors disposed thereupon. Similarly, in retrofit applications, where the circuitry or the second ICs need to be replaced or upgraded, an updated second circuit board may be installed with minimal labor. The sequestration of the first and second ICs upon their respective supporting primary and secondary circuit boards reduces the number of connections required between the two circuit boards down to a minimum, thereby saving on size and cost.

These and other objects, advantages and features of the invention shall become more evident in a reading of the following detailed description.

BRIEF DESCRIPTION OF THE DRAWINGS

Throughout the course of the following detailed description, reference will be made to the following drawings in which like reference numbers identify like parts and in which:

FIG. 5A is an end elevational view of the structure of FIG. 5 taken generally along lines A-A thereof and with the network cables removed for clarity and illustrating the hollow nest;

FIG. 7C is a partially exploded view of FIG. 7, illustrating the arrangement of electronic elements on the primary circuit board and the manner of connecting the primary and secondary circuit boards together;

FIG. 7E is an end view of the assembly of FIG. 7, taken from lines E-E thereof;

FIG. 8A is an exploded view of the secondary circuit board of the assembly of FIG. 8;

DETAILED DESCRIPTION OF THE PREFERRED EMBODIMENTS

The following description is intended to convey the operation of exemplary embodiments of the invention to those skilled in the art. It will be appreciated that this description is intended to aid the reader, not to limit the invention. As such, references to a feature or aspect of the invention are intended to describe a feature or aspect of an embodiment of the invention, not to imply that every embodiment of the invention must have the described characteristic.

Figure 1:
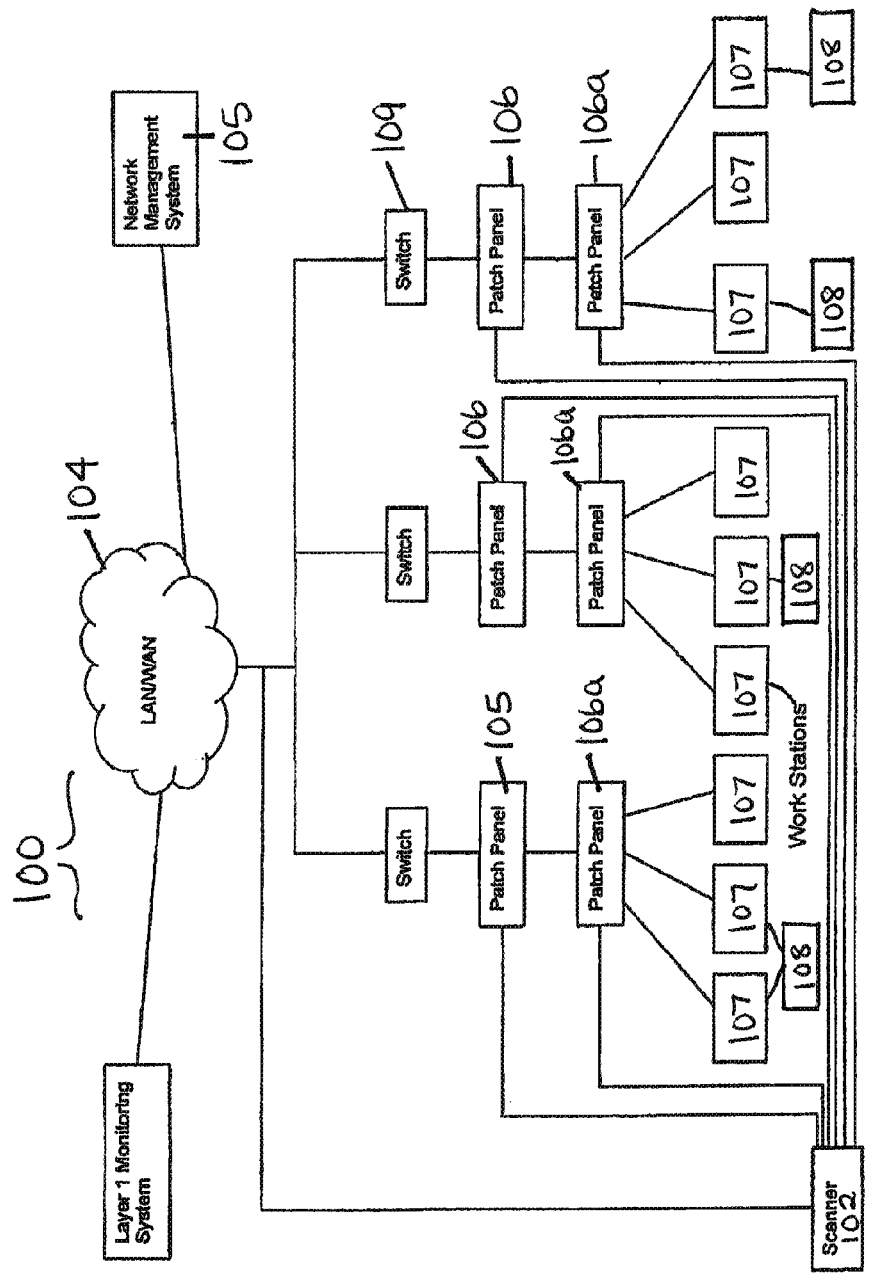
FIG. 1 is a system diagram that illustrates an electronic data transmission network including patch panels, scanners and a server.

Turning to the drawings and referring first to FIG. 1, a typical computing, or data transmission, network 100 is illustrated to show the environment in which the patch panel assemblies of the present invention are used. An example of such a data network is a corporate electronic computing network with multiple users and network and end-user devices connected thereto by which network users can access, exchange and store data. As used herein, the term "end-user device" refers to a physical item that is connected to a work area outlet and which can be operated by any user of the network and may include, without limitations, a personal computer, telephone, printer, facsimile machine, monitor or other devices, while the term "network device" refers to a physical device that is accessed but not necessarily operated by a user of the network and may include, a scanner, server, switch, patch panel and the like. The network preferably includes a scanner 102, which is used to monitor the network devices that are connected to the network 104 and which are connected via a series of patch panels 106. The scanners 102 monitor the network devices which are connected to the network. In one embodiment, the scanner 102 communicates with the patch panels 106 using a serial data connection. Each patch panel 106 is further connected to multiple network devices or the work area outlets 107 by way of a switch 109. By connecting ports between the patch panels 106 with a patch cord, various network devices can communicate with each other. Switches 109 poll, or take an inventory of, all the network devices which are connected to the network. The switches 109 can probe all of the outlets on the network in order to catalog connected network devices and in doing so, perform an inventory of all the network devices attached to the network. A server 105 is connected to the switch 109 which is connected to the patch panel 106 and it may serve as a component that instructs the switches 109 to probe the connection ports of the patch panels 106.

The patch panels 106 may be mounted singularly, or as a group in a rack within a dedicated wiring room, such as a wiring closet. These patch panels 106 have a plurality of individual ports into which cables may be inserted to connect the ports on various panels together or to connect the ports to devices located upstream of the patch panels 106, such as switches 109. The rear of each connection port has a multi-wire network cable terminated to it, which leads to a data communication, or work area outlet 107 located remote from the patch panel 106a to which a network device may be connected. The work area outlets 107 are found in work stations, in an office or the like, in a location where a network user has a computer, printer, etc. available to him for use. The switches 109, patch panels 106 work area outlets 107 and end-user devices 108 cooperate to form the portion of the network 104 which the scanner 102 monitors. The patch panels 106 may connect upstream to a server and down stream to individual devices such as personal computers, laptop computers, VoIP ("Voice Over Internet Protocol") phones, facsimile machines, and printers or the like. The work area outlets 107 represent one set of connection points of the data network.

Certain of the end-user devices must be connected to other end-user and network devices on the network, such as a telephone, facsimile machine and/or modem, all of which must be connected to a public telephone exchange. Similarly, a VoIP phone must be connected to the Internet and so on. Furthermore, the personal and laptop computers and printers must be connected to the server and storage devices of the network so as to ensure complete communication with each other and in order to access materials held in storage. A switch 109 allows these devices to communicate with each other. However, because the patch panel 106a located closest to the end-user devices 108 is typically the final interface with the end-user devices, that patch panel 106a must be properly connected to other network devices if the interface is to relay information from the end-user devices to the network devices. When physical connections between the network devices and network switches are moved, added or changed, the patch panels in a network are the points where the moves, additions or changes are completed by technicians changing, adding or moving cables between various ports of the patch panels. As such, the patch panels may include a plurality of visual indicators, preferably in the form of lights or LEDs 59 that are associated with single ports of the patch panels. These lights are lit in response to various conditions of the network and the illumination of these lights may be used to assist a technician in the task of moving, changing and removing patch cords.

The infrastructure management system is one with an ability to monitor all the devices connected to the network. For example, the master server 105 may monitor the issuance of various protocol addresses, and in some network environments, select and distribute such protocol addresses from a host server when they connect to the network. In such an environment, the server 105 can monitor the issuance of IP addresses use such information to assist in managing the network and poll newly connected network devices using a simple network management protocol.

The interface between the network devices and the network switches occurs at a patch panel and as noted above, the patch panels 106, 106a are locations at which technicians make desired, or requested, changes to a network by adding, removing, moving or changing cables. As noted above and with specific reference to the network illustrated in FIG. 1, the work area outlets 107 and any individual end-user devices 108 connected thereto form one set of connection points on the network. In this regard, one set of patch panels 106a is the last component in the network before the end-user devices and these patch panels 106a are the primary location where the changing of patch cords/cables takes place. These patch panels 106a may be thus considered as the final interfaces, or junctions, between the server 105 and scanner 102 of the network and the individual end-user devices 108 connected to the work area outlets 107. As noted in FIG. 1, these patch panels 106a are interconnected to the end-user devices at the work area outlets 107.

Figure 2:
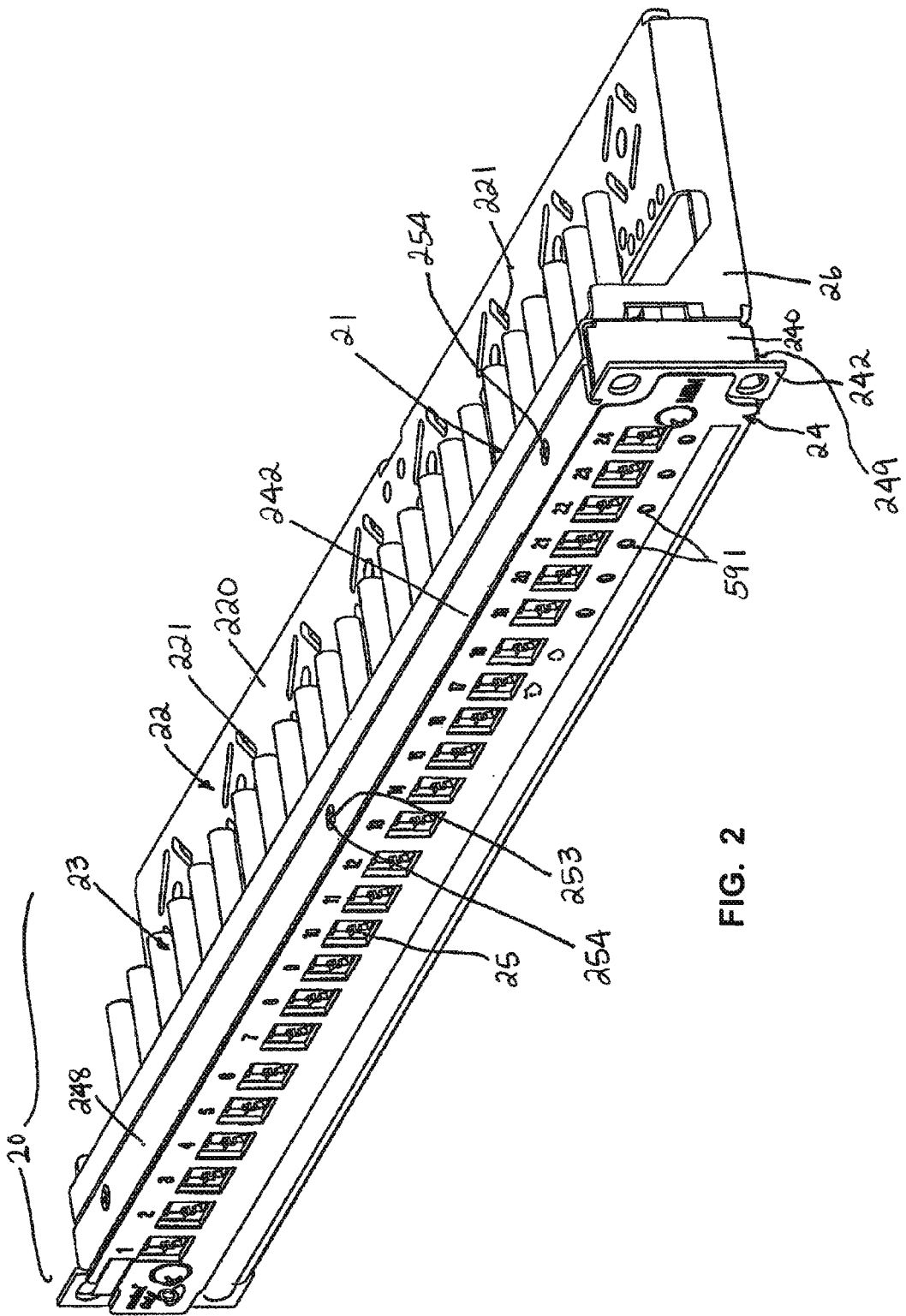
FIG. 2 is a perspective view of a patch panel assembly shown separated from a mounting rack or other similar device.
Figure 5:
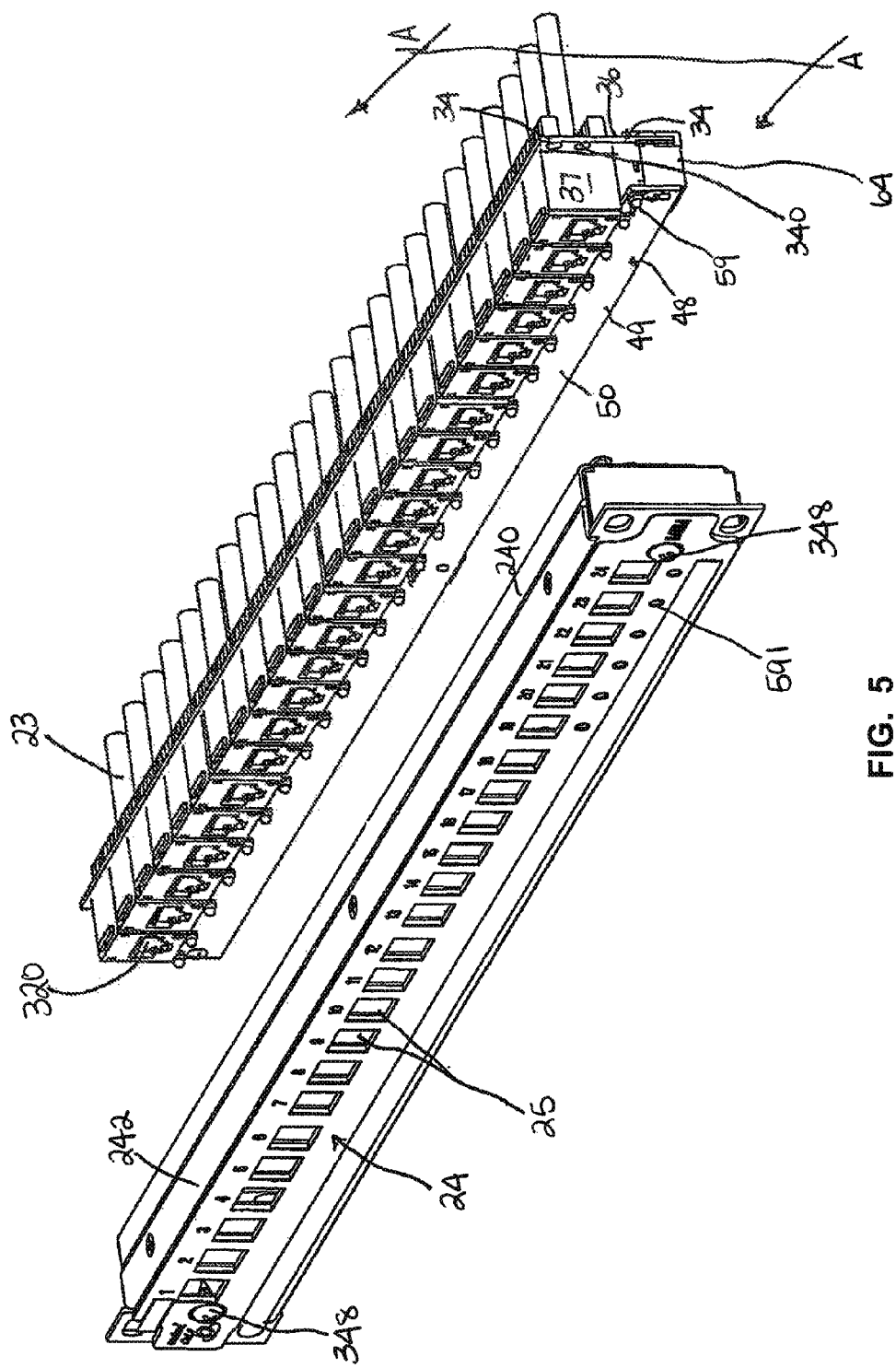
FIG. 5 is an elongated view of the panel faceplate and structure components of FIG. 4, but with the carrier removed for clarity.

Typically, the patch panels 106a will be arranged in an array within a dedicated room within a business, which is commonly known as a switch, or wiring, closet. The closet may contain one or more racks, typically vertical and each rack is slotted to host a plurality of individual patch panels. A patch panel 106 utilizing a patch panel assembly 21 is illustrated in FIG. 2 and can be seen to include a carrier, or wire management member, 22 that can be used to hold the panel's accompanying network cables 23 in place within a rack (not shown). The patch panel assembly 21 also includes a face panel 24 that may have a plurality of individual connection ports 25 disposed therein that are adapted to receive various cables in the form of patch cords and the like (not shown). The face panel may also include a lighted display or other visual indicator, such as a light, light pipe, light-emitting diode (LED) or the like associated therewith for displaying the connectivity of the end-user devices 108 connected to the work area outlets 107. The face panel 24 lies adjacent to and in front of a front cover member 242, and it is attached to the front cover member 242 by way of screws 348. (FIGS. 5 & 5A.) The carrier 22 is preferably formed of metal with a thickness sufficient to support the weight of the assemblies without buckling and may include attachment arms 26 disposed on opposite ends of a baseplate 220, and the arms 26 include holes 27 and clips 28 formed therein that can be utilized with screws 29 and/or tabs 30 to mate with a cover 30 that fits over the face panel 24. The carrier 22 may also be used, as shown, to mount the patch panel assembly 21 into a patch panel so that the patch panel assembly 21 acts as an integral structure that can be inserted and removed from the mounting rack as a single piece. When the carrier 22 is assembled to the face panel 24, the entire structure has a general L-shaped configuration that can be slid into and out of a position in a mounting rack in a wiring closet.

The connection ports 25 of the face panel 24 are aligned with and are disposed adjacent to a set of first connectors 31 that are shown as jacks 32, preferably RJ-11 or RJ-45 style jacks, but it will be understood that other connectors, including optical fiber connectors may be used in the assembly 21. The jacks 32 provide a means by which to connect work are outlets 107 to particular connection ports via a particular network cable 23 and do so with interior receptacles that receive the aforementioned patch cords or cables. The connectors 31 are mounted in a linear array preferably in side-by-side order, on a primary panel 34, shown in the form of an elongated first printed circuit board 36 that extends the full width of the face panel 24 and the patch panel assembly 21. As shown, the connectors 31 are preferably spaced apart from each other a preselected distance to match the spacing of the face panel connection ports 25, but in some instances they may abut each other as a unitary block of connectors. The patch panel assemblies described herein utilize two elongated members that are generically referred to as panels due to their depicted configuration, and in the preferred embodiment as circuit boards. Other structures equivalent in form and function may be utilized in their place.

Figure 7:
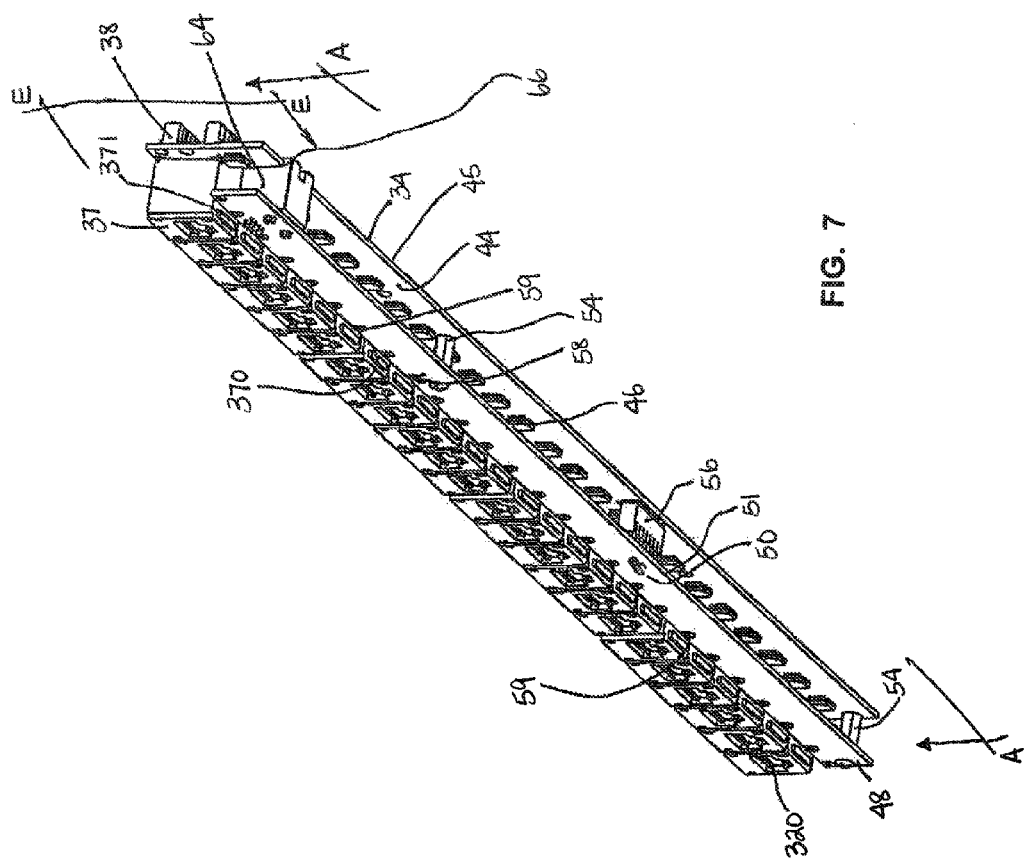
FIG. 7 is a perspective view, taken from the front of and below the patch panel assembly of FIG. 5, with the cables removed for clarity.
Figure 7A:
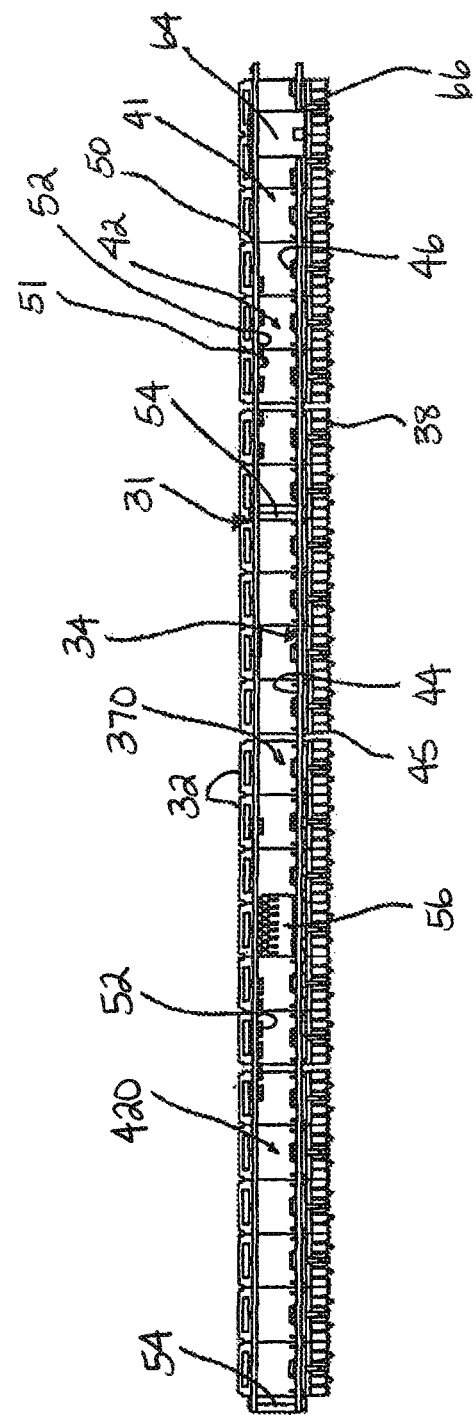
FIG. 7A is a bottom plane view of the patch panel assembly of FIG. 7, taken from below along lines A-A thereof.
Figure 7B:
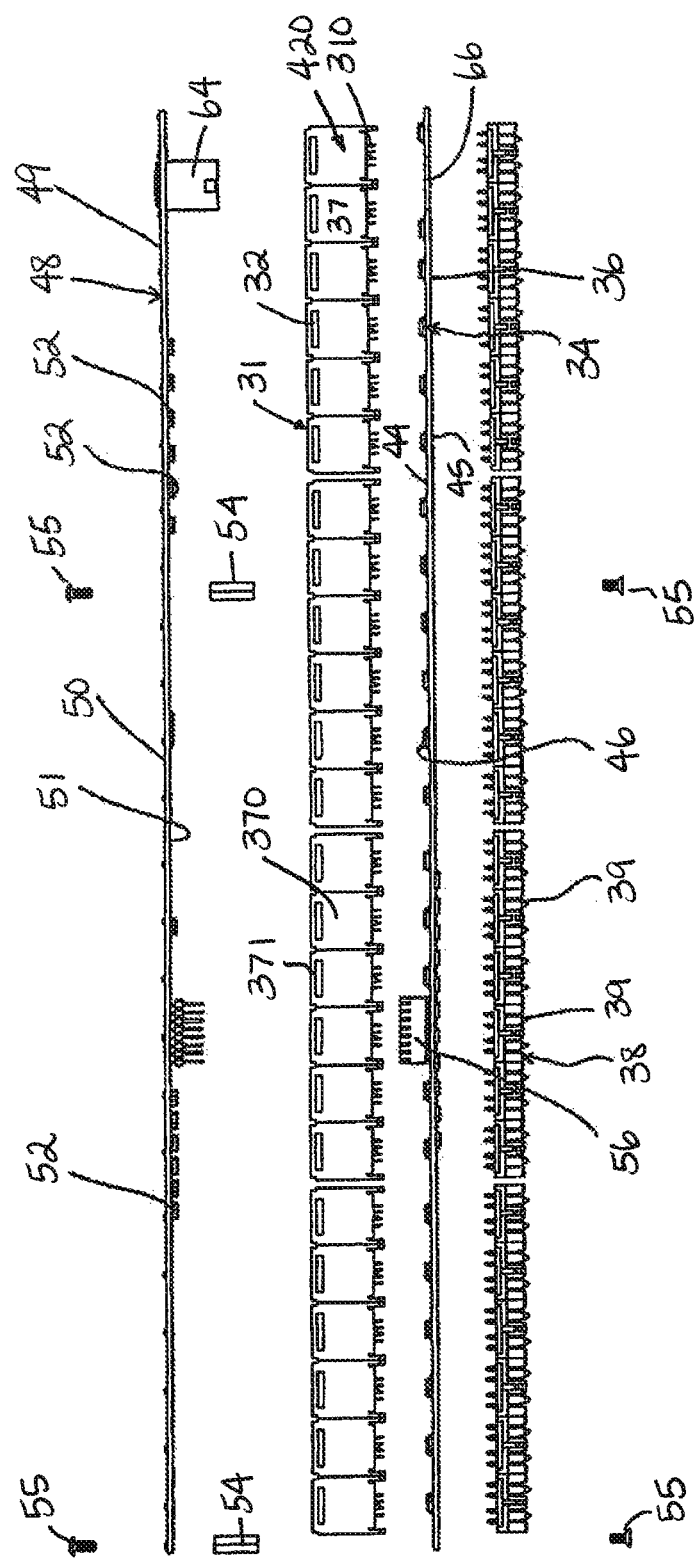
FIG. 7B is an exploded view of the assembly of FIG. 7A.
Figure 7D:
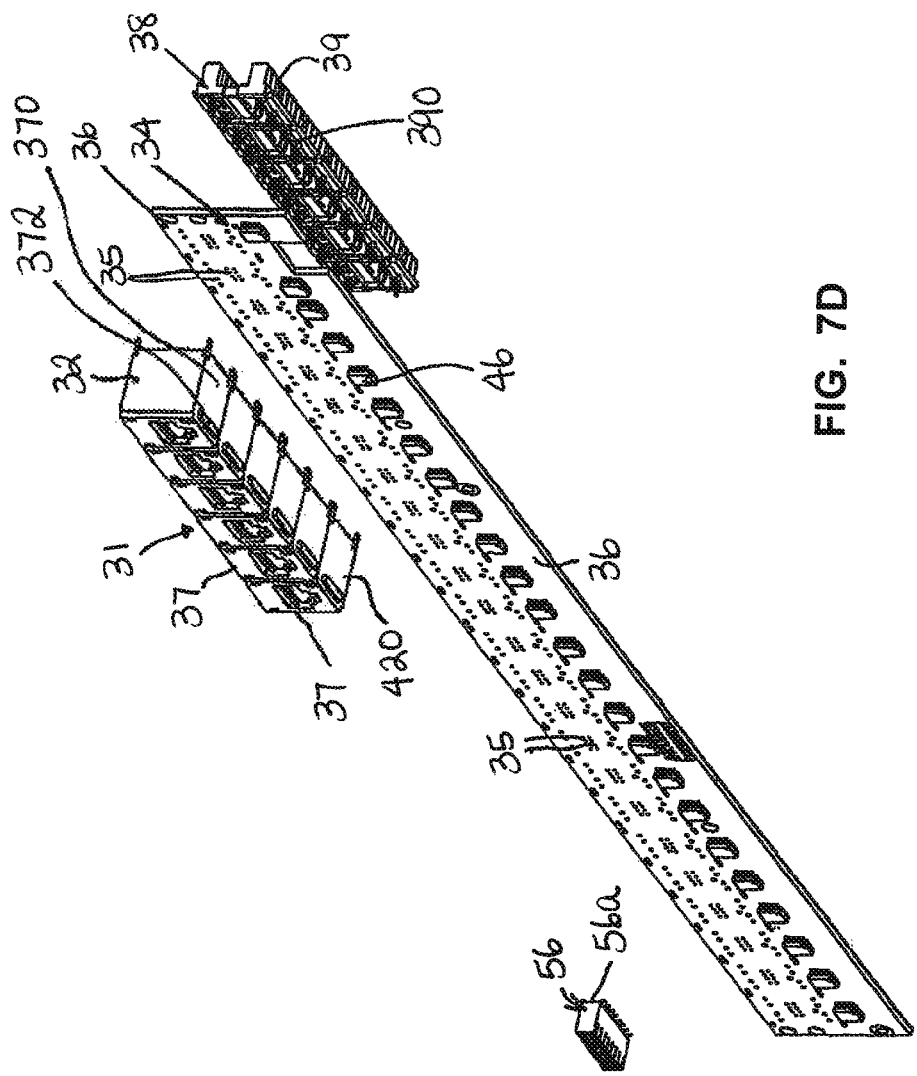
FIG. 7D is an exploded view of the assembly of FIG. 7C.

In the illustrated embodiment, and with particular reference to FIG. 7D, the connectors utilized for the assembly may include jack housings 37 which are mounted on a front surface 44 of the first circuit board 36 for receiving the male ends of patch cords, and termination ends 38 are mounted on the opposite, rear surface 45 of the primary circuit board 36. Each jack 32 has an opening 320 disposed in the front of its housing 37 that leads to an interior receptacle 321 that houses conductive terminals to which are terminated the wires of the cables 23. The jack openings 320 are preferably aligned with the connection ports 25 of the face panel 24. As noted above and as shown best in FIGS. 7C and 7D, the jack housings 37 are preferably aligned with each other and arrayed on the primary, or first, circuit board 36 in side-by-side order so that their bottom walls, or faces, 370 define a common surface 420 that preferably extends widthwise along the first circuit board 36. The jack housings 37 may include stop members 371 disposed on either the top or bottom or both surfaces of the housings 37. As shown in the drawings, these stop members 371 abut the front cover member 242 or the face panel 24 or both to limit the extent to which the jack housings 37 fit into the connection ports 25.

Figure 6:
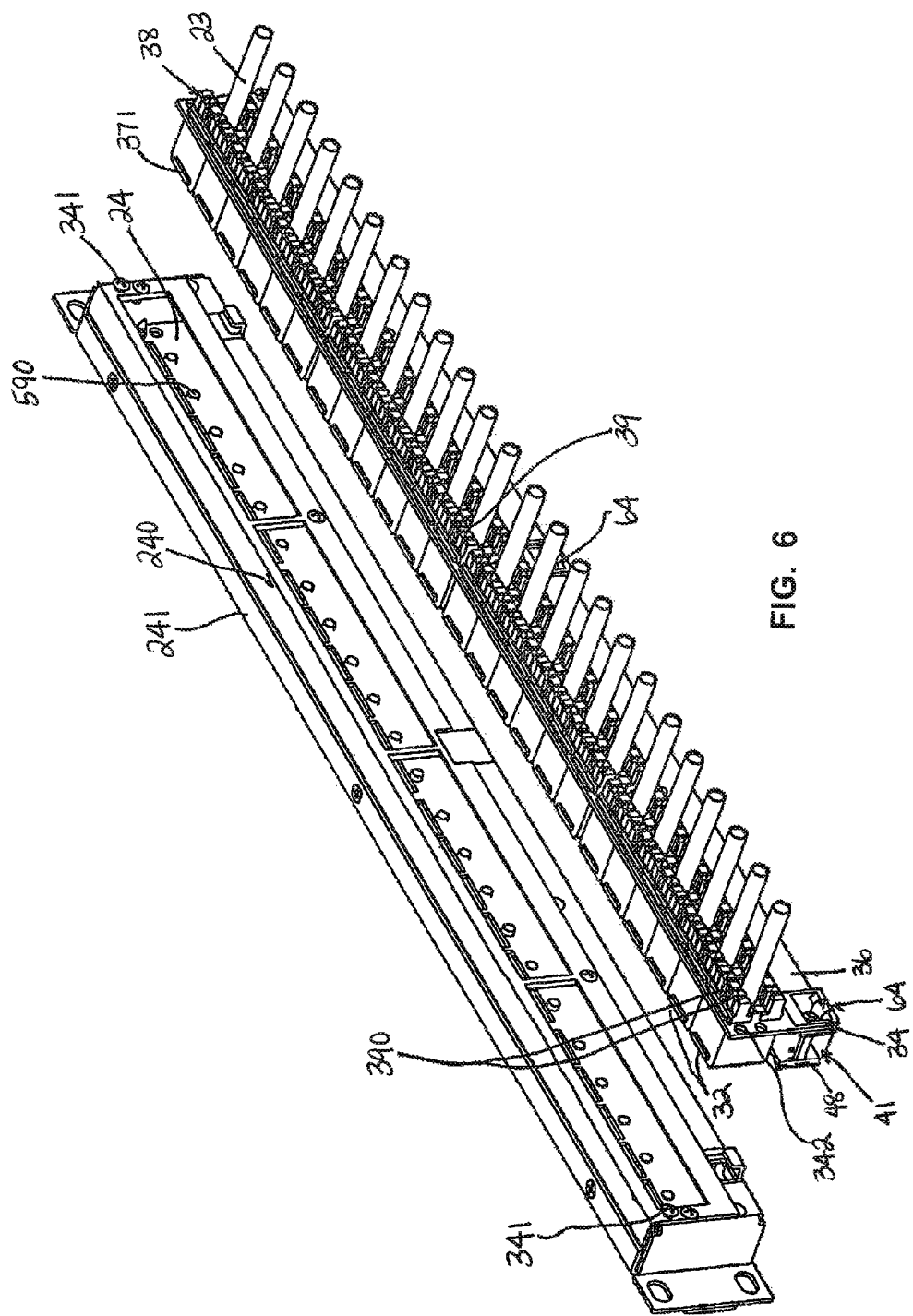
FIG. 6 is the same view as FIG. 5, but taken from the rear.
Figure 8:
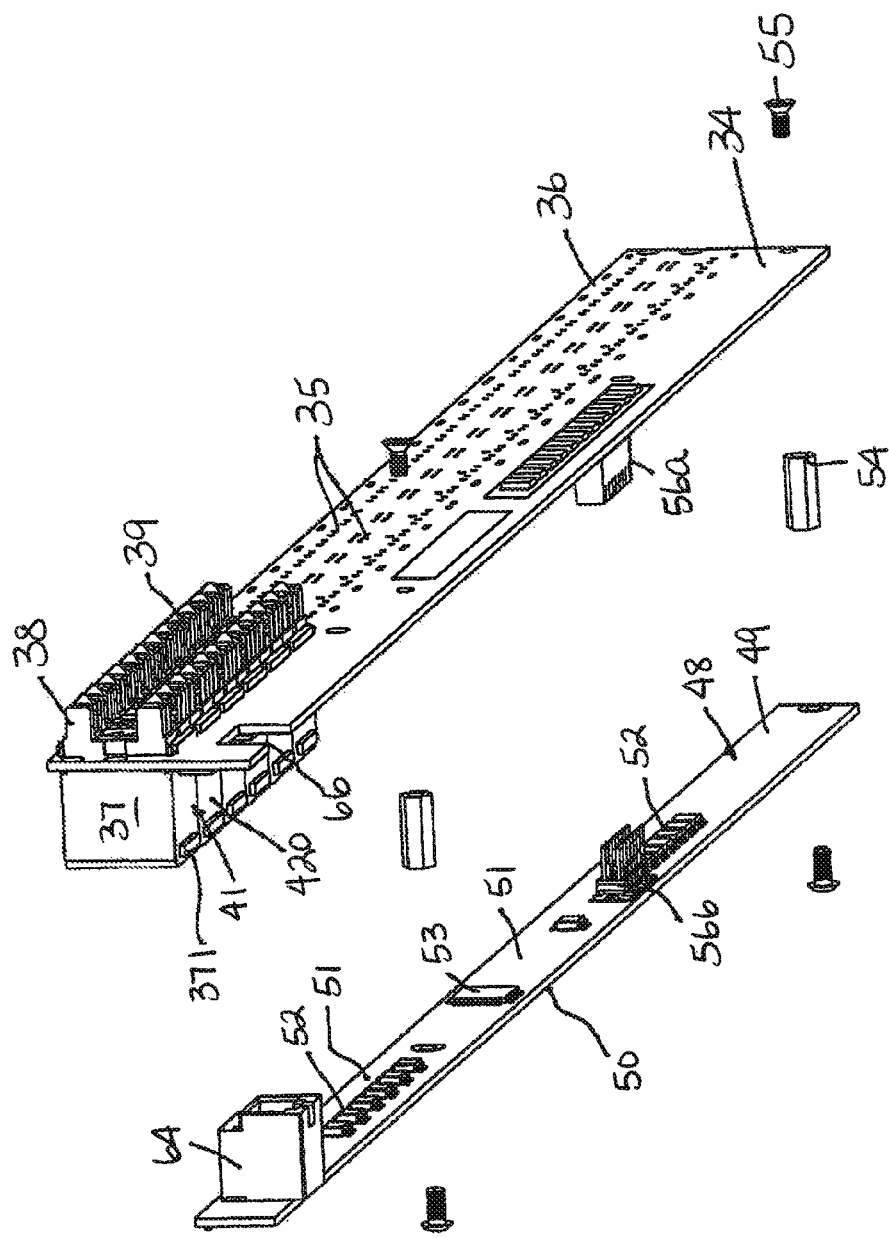
FIG. 8 is an exploded perspective view of the assembly of FIG. 7, taken from the rear.
Figure 8B:
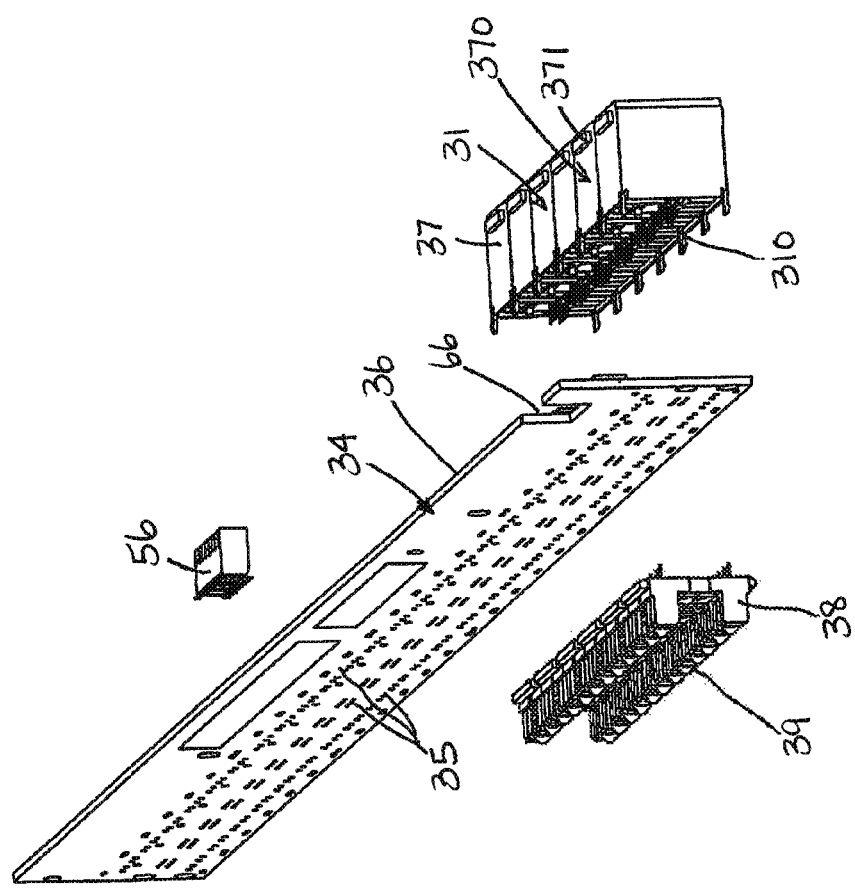
FIG. 8B is an exploded view of the primary circuit board of the assembly of FIG. 8, taken from the rear thereof.
Figure 9:
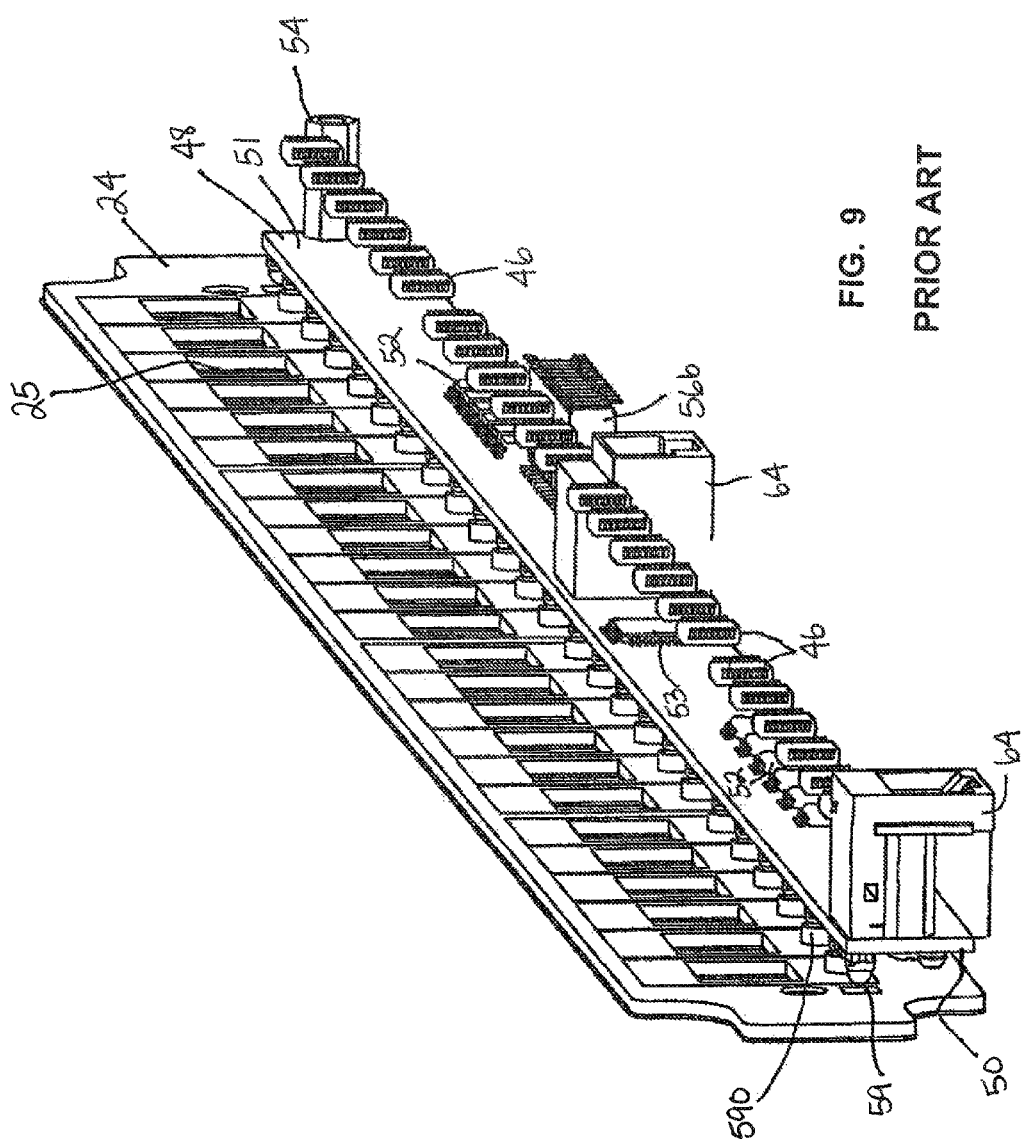
FIG. 9 is a partially exploded view of the patch panel assembly of FIG. 5, with the primary circuit board and face panel shroud components removed for clarity.

The termination ends 38 may be separate from the first connectors (jacks 32) that provide connections to the individual wires of the network cables 23, or they may be formed as part of the jacks 32, in which the first circuit board 36 may have openings formed therein which hold the jacks 32 in place. As illustrated in FIG. 8, the termination ends 38 may include a plurality of projecting studs 39, which hold conductive insulation displacement technology ("IDT") terminals 390 (FIGS. 6 and 7D). Individual wires of the network cables 23 that lead to the work area outlets 107 are terminated to these IDT terminals using a termination tool (not shown) that is engaged with the termination ends and then pressed down to force the network cable wires into slot disposed between the projecting studs 39 in which the IDT terminals are held. This assembly step requires the exertion of force(s) upon the jack termination ends 38 and which may be likely to cause inadvertent impact to the first circuit board 36 by the tool.

After termination, the network cables 23 are then extended out from the termination ends 38, transversely across the baseplate 220 of the carrier 22, where, if desired, retainers, such as cable ties or the like, may be threaded through the perforations 221 in the baseplate 220 to anchor the network cables 23 to the carrier 22. In order to provide flexibility to the cables 23, the baseplate 220 is spaced apart from the face plate 24 in the rearward direction.

The first circuit board 36 may have a plurality of vias 35 formed therein which are plated so that they can connect the various terminal mounting tails 310 of the jack terminals 32 to circuits on the primary circuit board 36, as well as to terminal tails of the termination blocks 38. Preferably, the jack housings 37 are arranged in a linear array along one surface 44 and edge of the first circuit board 36. In this regard, they project forwardly of the first circuit board 36 for a predetermined distance. The jack housings 37 preferably have their bottom surfaces or edges aligned with each other in order to define an open space 41 underneath and adjacent to the jack housings 37. This open space 41 extends adjacent the jack housings 37 and runs underneath the jack housings 37. Also, the jack housing 37 all have their receptacle openings 320 facing one direction, forwardly, as shown in the drawings, while the second connectors, or the termination ends 38 have their termination faces facing the opposite direction. As explained in further detail below, this open space 41 is formed into a protective, hollow nest 42 by the interaction among the first and second circuit boards 36, 49 and the jack housings 37.

A secondary panel 48 is also provided and it takes the form of an elongated second printed circuit board 49 that extends widthwise of the patch panel assembly in opposition to the primary panel 34, and which is preferably smaller in size than the first circuit board 36 in order to permit the mounting of the connectors 31 on the first circuit board 36. The two circuit boards 36, 49 are spaced apart from each other to provide sufficient room within the hollow nest 42 to accommodate both the ICs 45 of the first circuit board 36 and the other ICs 52 arranged on the second circuit board 49. This spacing is accomplished by spacers, or standoffs, 54 which are interposed between the two circuit boards 36, 49 and which are threaded to receive screws 55 therein to space the first and second circuit boards 36, 49 apart, preferably in a parallel fashion, so that the space available within the hollow nest 42 for components is the same for the full width of the patch panel assembly. The spacers 54 provide a mechanical connection between the two circuit boards 36, 49 and by one or more second connectors 56 (utilizing two interengaging connector halves 56a, 56b) may be utilized to provide both mechanical and electrical connection therebetween, but such connectors 56 are relied upon to provide primarily an electrical connection. As shown in FIG. 5, it is preferred that the second circuit board 49 be disposed slightly rearwardly of the front surface of the jack housings 37 so that the jack housings 37 and the LEDs 59 may be received in holders 590 of the front cover member 242 and the openings 591 of the face panel 24.

Figure 2A:
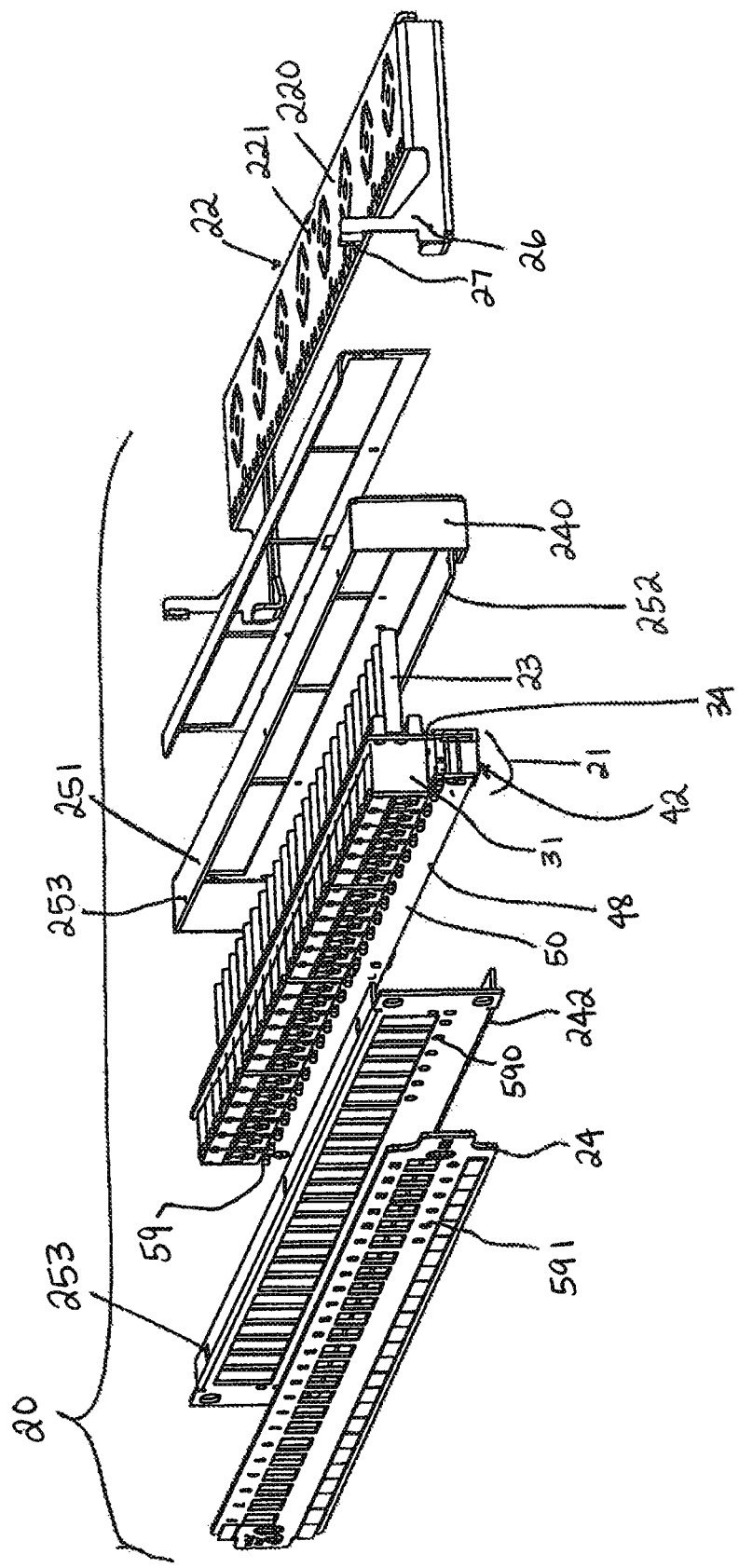
FIG. 2A is an exploded view of the patch panel assembly of FIG. 2.
Figure 2B:
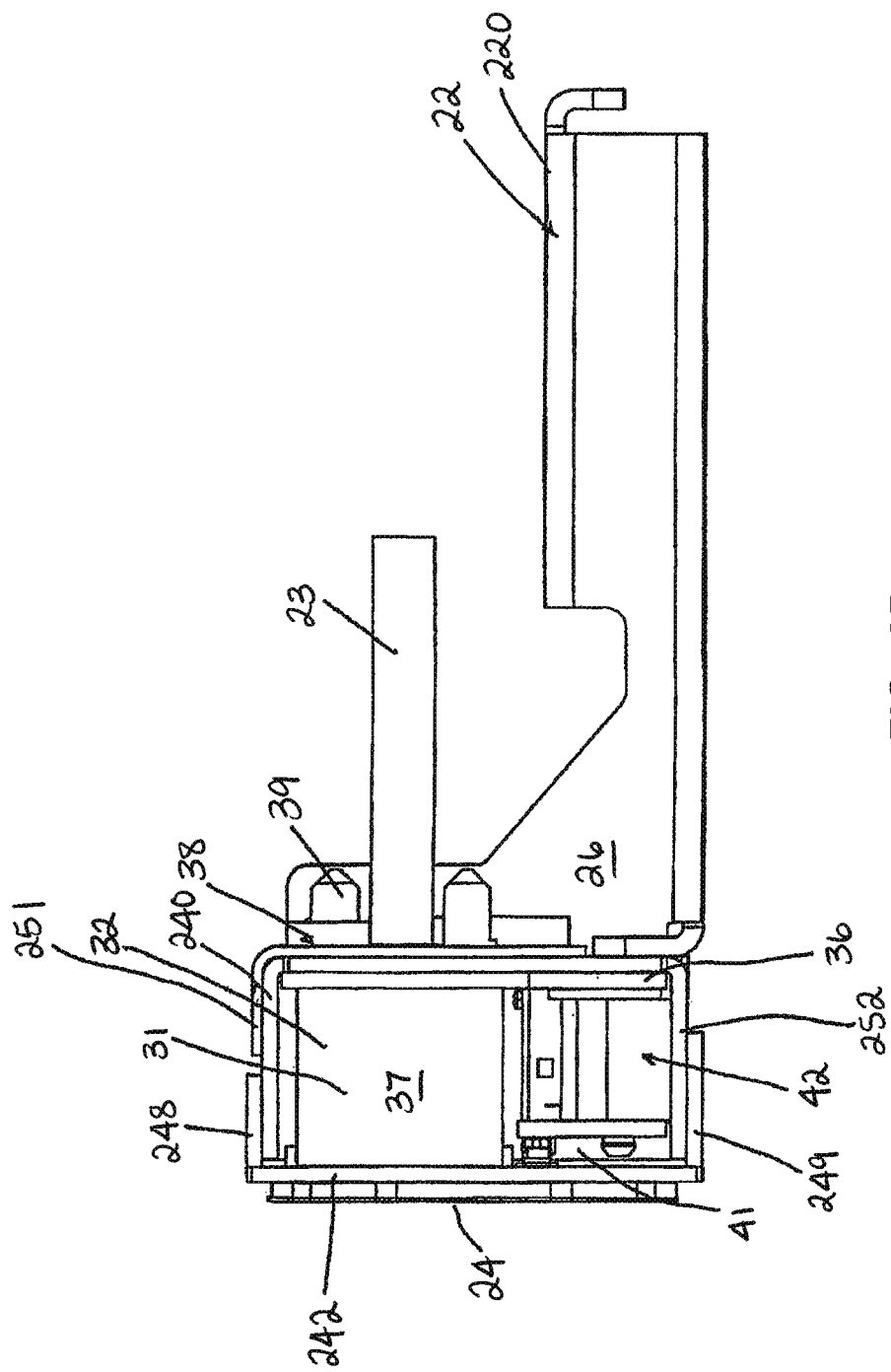
FIG. 2B is a sectional view of the patch panel assembly of FIG. 2, taken along line B-B thereof.

As shown in FIGS. 7C & 7E, the hollow nest 42 of the patch panel assembly accommodates a series of electronic elements, such as a plurality of first integrated circuits ("ICs") 46 that are mounted to the front surface 44 of the first circuit board 36 proximate to and underneath the jacks 32. These ICs 46 may be controllers, multiplexers, logic devices and the like which are operatively connected to the connectors 31 via appropriate circuitry, so that they may read the operational status of the work area outlets and the devices connected to the network at the outlets. The termination ends 38 of the jacks are positioned on the rear surface 45 of the first circuit board 36 and the network cables extend away from them over the baseplate of the carrier 34. A rear cover member 240, shown in the drawings as comprising two overlying pieces, is provided as part of the assembly and it has an opening 241 through which the cables 23 and the termination block studs 39 extend. The front cover member 242 has upper and lower flanges 248, 249 (FIGS. 2A & 5A that extend rearwardly and fit over similar flanges 251, 252 of the rear cover member 240. Screws 254 are used to hold the front and rear covers together in an overlapping fashion, as illustrated in FIG. 2B.

The first circuit board 36 contains circuit paths, such as conductive traces on the circuit board, and preferably all of the circuit paths between typically the jacks, their termination ends and the first ICs are entirely contained on the primary circuit board 36. In this manner, the first ICs are dedicated to network data transfer and status information about the work area outlets 107 and the server 105, meaning they receive information from the end-user devices connected to the work area outlets of the network or the status of the work area outlets 107 themselves, so as to monitor the status of the work area outlets 107 and the end-user devices 108. This information is subsequently transmitted to circuitry on the second circuit board 49, the second ICs and the processor 52. The second ICs are also preferably entirely contained on the second circuit board 49 and dedicated to operate the LEDs or other displays of the connection ports and transmit the information to the scanner 102.

Such an arrangement facilitates testing of the circuits in the field and reduces the likelihood of circuit problems due to poor interconnection between the primary and secondary panels. Additionally, it shortens the circuit path from any path that may include a segment on the secondary panel and by avoiding any connector interface, maintains the circuit electrical characteristics, such as impedance at a desired level.

Figure 3:
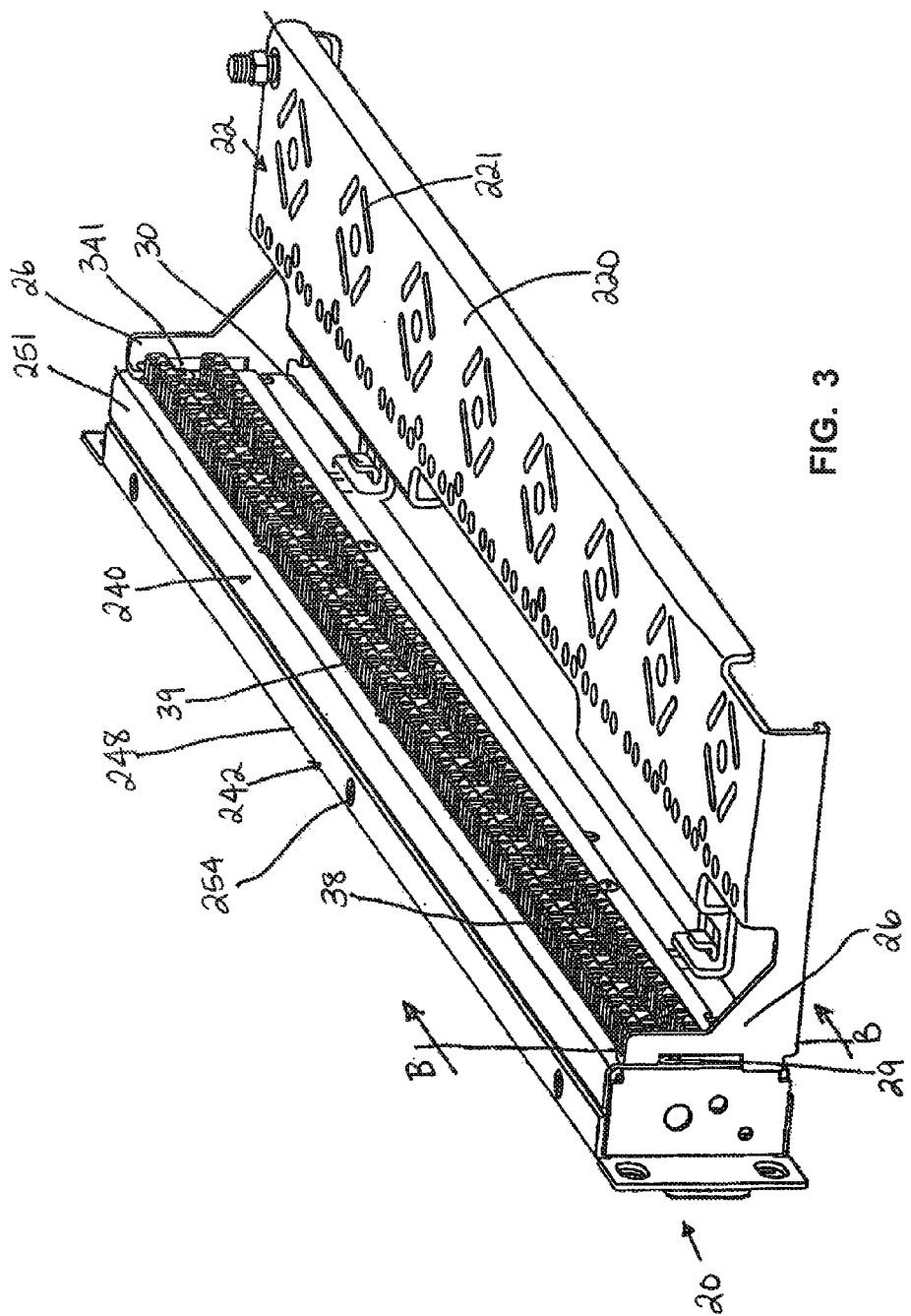
FIG. 3 is a rear perspective view of the patch panel assembly of FIG. 2 with the cables removed for clarity.

The front and rear cover members 242, 240 thereby enclose the first and second circuit boards 36, 49 and serve to assist in keeping them held together as a single unit as illustrated in FIG. 2. In this regard, the first circuit board 36 may include openings 340 formed therein (FIG. 5) which receive assembly screws 341 (FIGS. 3 & 6) associated with the rear cover member 240 and which extend through the rear cover member 240 to hold the first circuit board 36 in place through associated screw holes 340. Preferably, the cover members 242, 240 cooperate to hold the first and second circuit boards and the first connectors 31 associated therewith in place within the openings formed in the front cover and/or the face panel 24. The points of attachment of the screws 341 and the holes 340,342 are all preferably disposed on the first circuit board 36 outside the array of first connectors 31 rather than in the area of the connectors 31 or the open space 41 beneath them.

As shown in FIG. 2B, the rear cover member 240 lies in close position to the rear surface 45 of the first circuit board 36 so as to preclude positioning any additional components thereon on the rear surface of the first circuit board 36. During manufacturing of the assembly 21, a technician uses a termination tool to force the individual wires of each network cable 23 into the IDT terminals of the termination block 38, and in doing so, must press down on the termination block 38 while exerting a large pressing force. The technician's termination tool may slip out of contact with the termination block 38 and contact the rear surface 45 of the first circuit board 36 and contact the ICs if mounted there, with a large force that could damage them or their connections to the circuits on the first circuit board 36. Therefore the first ICs 46 are advantageously mounted on the front surface of the first circuit board 36. Additionally, were the first ICs 46 to be mounted on the rear surface 45 of the first circuit board 36, they may encounter electrical interference during operation due to the close proximity of the metal rear cover member 240 to them. By mounting them on the front surface 44 of the first circuit board 36, the first circuit board 36 itself acts as a shield to prevent any such interference or shorting contact. This also holds for mounting the second ICs 52 of the second circuit board 49 on the interior (rear) surface 51 thereof.

As shown in FIG. 8, the second circuit board 49 supports the plurality of other, or second ICs 52 that, in operation, monitor the logic devices (ICs) 46 of the first circuit board 36 and such ICs may also include multiplexers, logic devices and the like. The second circuit board 49 also preferably includes a processor 53, or other similar device, that receives input from the ICs 46 and which controls the operation of the visual indicators 58 based upon input generated by the first ICs 45, which indicate the status of the work area outlets 107 and illuminate the LEDs 59 accordingly. In the preferred embodiment, the processor 53 controls the LEDs 59, communicates to the scanner 102, interprets results received from the first ICs 46 (multiplexers) of the first circuit board 36 and conveys and reads information to and from the first circuit board 36.

In this manner, the LEDs 59 may be illuminated in one color or position to indicate a work area outlet 107 has an end-ser device 108 connected thereto and is in proper operation; in another color to indicate an open work area outlet with no end-user device connected; and, in yet another color to indicate connection ports 25 on the patch panels 106 that need to be interconnected with a patch cord by a technician, as well to indicate a proper connection.

The second circuit board 49 further supports a plurality of visual indicators 58 on its front surface 50, which preferably take the form of light-emitting diodes 59 (LEDS) or the like. These LEDs 59, as shown in FIGS. 2B & 7, extend forwardly from the second circuit board 49 toward the face panel 24, and are also arranged in a linear array along the front surface 50 of the second circuit board 49 and in alignment with each of the connection ports 25 of the face panel 24. The LEDs 59 are received within holders 590 on the front cover member 242 that communicate with openings 591 formed in the face plate 24. These LEDs 59 will be activated upon command from the scanner 102 of the network 105 to illuminate a respective connection port 25 for identifying: (i) a connection port 25 that needs its patch cord changed; (ii) a proper connection between the patch panel 106a and another patch panel 106 or switch 109; (iii) an open work area outlet 107 where the network device 108 has been removed from the network, or other network conditions. The LEDs 59 may be controlled by the processor 53 mounted on the second circuit board 49, based upon information received from the first circuit board ICs 46. Although LEDs are described in the preferred embodiment as the visual indicators it will be understood that they are exemplary indicators for use due to their size and power consumption and other indicators, such as light bulbs, light pipes, etc. may be used.

Figure 4:
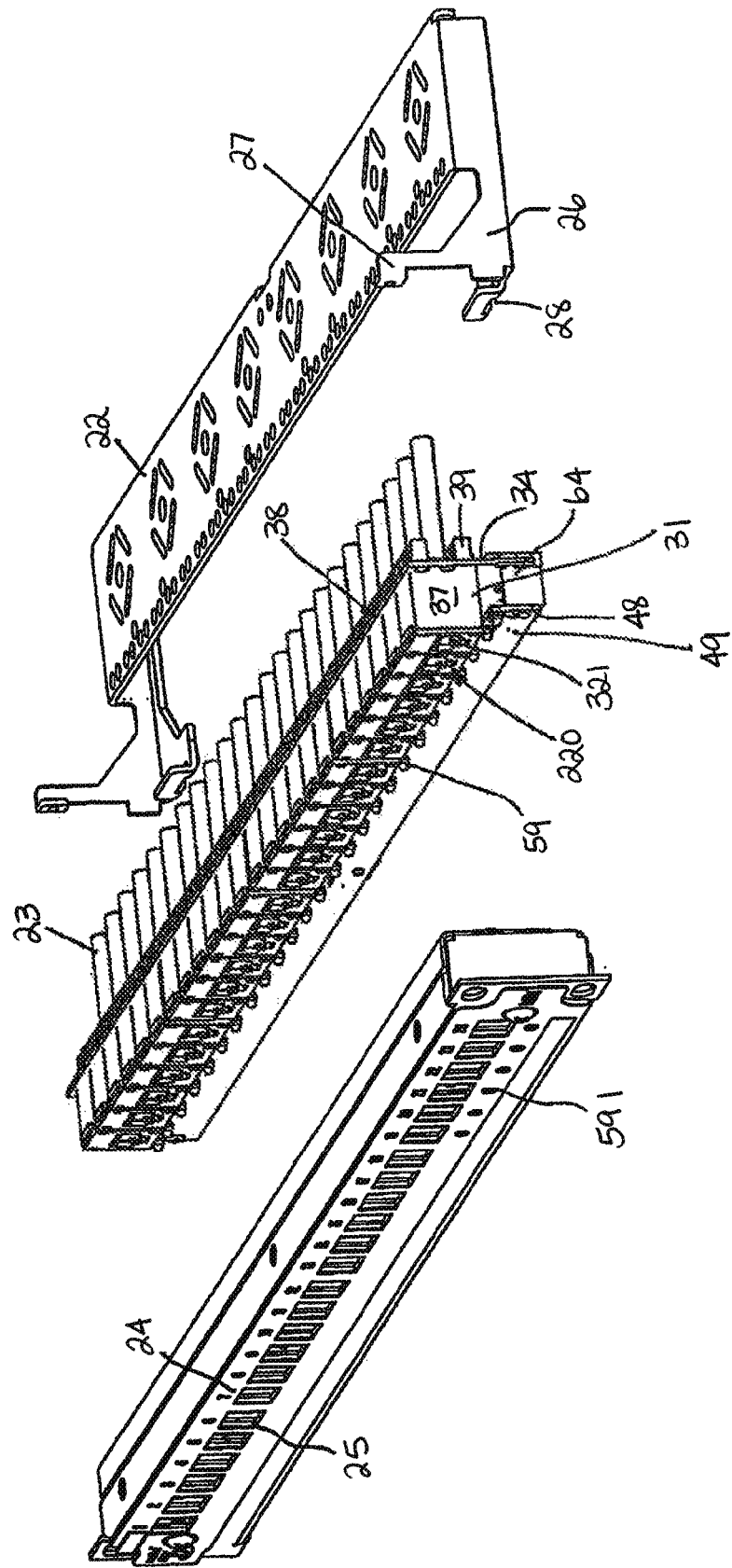
FIG. 4 is partially exploded view of FIG. 2, with the patch panel assembly separated from a carrier for insertion into a mounting rack and a face panel that partially covers the patch panel assembly.

The hollow, protective nest 42 is thereby formed by not only the first and second circuit boards 36, 49, but also the bottom walls, or surfaces 370 of the jack housings 37. This is shown respectively by the letters "A", "B" and "C" used on FIG. 5A. The two circuit boards 36, 49 primarily define the hollow nest and the space created therebetween protects the ICs from contact and impact on the outer surfaces thereof as well as from contact with the front and rear cover members, while the jack housings 37 serve to provide a shield along the top of the hollow nest 42. The jack housings 37 extend over the hollow nest and preferably extend over the top edge of the second circuit board. The nest 42 is further closed off, as shown in FIG. 4 by the bottom flanges 249, 252 of the front and rear cover members. The top edge of the second circuit board 49 is shown in the drawings as generally adjacent the bottoms of the first connectors 31 and it may, if desired extend up to and abut the connectors. A sufficient amount of protection would also be provided to the ICs in the nest by just the two circuit boards, if desired.

The second circuit board 49 is arranged underneath the jack housings 37 and spaced apart from the first circuit board 36 to define the depth of the nest 42, while the bottom edges of the first and second circuit boards 36, 49 and the jack housings 37 define the height of the hollow nest 42. The width of the second circuit board 49 panel also defines the width of the hollow nest 42. The first and second ICs 46, 52 mounted on the first and second circuit boards 36, 49, preferably in opposition to each other in order to save on space. This also eliminates any need for mounting the ICs on the rear surface of the first circuit board 36 and the front surface of the second circuit board 49, where the ICs would confront and be likely to come into contact with either or both of the front and rear cover members 242, 240 as noted above. Hence, the hollow nest 42 underneath the jacks 32 and between the two circuit boards 36, 39 provides an area for mounting the ICs 45 without enlarging the overall depth of the patch panel assembly and provides additional benefits than just protection for the first and second ICs, including isolating the two circuit boards from stresses incurred during assembly of the patch panel assembly and installation of the same into a rack.

Inasmuch as the second ICs 46 on the secondary circuit board 49 will receive information from the network work area outlets 107 and the devices connected thereto, they must also have a means to communicate with the scanner 102 of the network. One or more second, or panel connectors 64, may be used to provide such a connection, and one is shown mounted to the second circuit board 49 in FIGS. 7 & 8. This second connector (or connectors) and also is preferably provided as a RJ-45 jack connector with an interior receptacle opening 66 that can receive a common RJ-45 patch cord or other plug connector, rather than a specialized cable and connector. The second connectors 65 are mounted to the secondary circuit board 49 in communication with the circuits for each port 25 and LED 59. This connector 64 is mounted in a direction reverse than that of the first connector jacks 32, i.e., its receptacle opening 66 faces rearwardly in a direction opposite to the first connectors 31 so as to provide a point of connection for each patch panel 106 to the scanner 102, as shown in FIG. 1. The panel connector 64 extends through the hollow nest and a notch 66 formed in the primary panel 34 along the bottom edge thereof. The hollow nest permits such a panel connector to be mounted on the second circuit board 49 rather than the first circuit board 36 and in doing so, keeps the depth of the assembly reduced.

It will be understood that there are numerous modifications of the illustrated embodiments described above which will be readily apparent to one skilled in the art, such as many variations and modifications of the compression connector assembly and/or its components including combinations of features disclosed herein that are individually disclosed or claimed herein, explicitly including additional combinations of such features, or alternatively other types of contact array connectors. Also, there are many possible variations in the materials and configurations. These modifications and/or combinations fall within the art to which this invention relates and are intended to be within the scope of the claims, which follow. It is noted, as is conventional, the use of a singular element in a claim is intended to cover one or more of such an element.

What is claimed is:

1. A patch panel assembly for operatively interconnecting together a plurality of work area outlets of a data network to at least one network device, the patch panel assembly comprising:
    a first circuit board having first and second opposing surfaces, the first circuit board including a plurality of first connectors disposed thereon, the first connectors being adapted to connect to network cables extending to the work area outlets;
    a second circuit board having first and second opposing surfaces and being spaced away from the first circuit board, the second circuit board including a plurality of indicators disposed thereon for selectively indicating at least one of the first connectors, the first and second circuit boards cooperatively defining a hollow nest therebetween;
    first integrated circuits disposed on the first circuit board, and operatively connected to the first connectors by first circuitry, for monitoring the status of the work area outlets; and
    second integrated circuits disposed on the second circuit board, and operatively connected to the indicators by second circuitry, for selectively operating the indicators.

2. The patch panel assembly of claim 1, further including a connector interconnecting the first and second circuit boards together.

3. The patch panel assembly of claim 1, wherein the first circuit board first surface and the second circuit board second surface confront each other and define opposing walls of the hollow nest.

4. The patch panel assembly of claim 1, wherein each first first connector includes a plurality of jacks, each jack having a front surface with a receptacle opening disposed therein for receiving a connecting plug and a rear surface with a network cable termination portion, the receptacle openings and termination portions facing opposite directions.

5. The patch panel assembly of claim 1, wherein each first connector includes jacks, and the jacks being arranged in a linear array on the first circuit board, the hollow nest being disposed beneath the jacks.

6. The patch panel assembly of claim 1, wherein the first circuit board is larger than the second circuit board.

7. The patch panel assembly of claim 1, further including at least one second connector for connecting the assembly to a network scanner, the second connector being disposed on the second circuit board and extending rearwardly through the first circuit board.

8. The patch panel assembly of claim 7, wherein the first circuit board further includes a notch formed therein, the second connector extending from the second circuit board through the notch.

9. The patch panel assembly of claim 1, wherein the first connectors and the first integrated circuits are mounted on the first circuit board first surface and the second integrated circuits are mounted on the second circuit board second surface, such that removal of the second circuit board provides access to the first and second integrated circuits.

10. A patch panel for operatively interconnecting a plurality of work area outlets on a data network to at least one network device remote from the work area outlets and the patch panel assembly, the patch panel assembly comprising:
    a face panel, the face panel including a plurality of openings disposed therein defining connection ports for receiving a plug connector, and a plurality of visual indicators for selectively indicating the connection ports;
    a primary circuit board having first and second opposing surfaces, the primary circuit board including a plurality of first connectors disposed on the first surface thereof, each first connector having receptacle openings disposed therein, each receptacle opening receiving one of the plug connectors therein, each first connector being arranged upon the primary circuit board such that the receptacle openings thereof are aligned with the face panel openings, each first connector projecting away from the primary circuit board first surface to define an open space adjacent thereto;
    a secondary circuit board having first and second opposing surfaces, the secondary circuit board being disposed in the open space and spaced away from the primary circuit board such that the secondary circuit board second surface confronts the primary circuit board first surface, the secondary circuit board including indicator elements associated with the face panel openings for selectively indicating the first connectors associated with the face panel openings to a user, the primary and secondary circuit boards cooperatively defining a hollow nest between the first circuit board first surface and the second circuit board second surface adjacent the first connectors; and
    a plurality of first and second integrated circuits respectively disposed on the first circuit board first surface and the second circuit board second surface within the hollow nest.

11. The patch panel of claim 10, wherein each first connector includes a plurality of jacks, each jack having a housing with an interior receptacle disposed therein, each interior receptacle including a plurality of conductive terminals disposed therein, each receptacle opening being disposed in a forward face of one of the jacks, the first connectors further including rear termination portions, each rear termination portion including a plurality of conductive terminals for terminating network individual wires thereto, the housing and the rear termination portion terminals being connected together such that a cable connected to one of the jacks may be connected to at least one work area outlet, the receptacle openings facing the face panel.

12. The patch panel of claim 11, wherein each housing is arrayed along the first circuit board first surface in a linear array and the hollow nest is disposed underneath each housing.

13. The patch panel of claim 10, wherein the secondary circuit board is smaller than the primary circuit board.

14. The patch panel of claim 13, wherein the secondary circuit board includes a plurality of LEDs disposed beneath the first connectors.

15. The patch panel of claim 13, further including a second connector for connecting the patch panel to a network component when the patch panel is connected to the data network, the second connector being disposed on the second circuit board and extending rearwardly therefrom through the hollow nest.

16. The patch panel of claim 15, wherein the second connector includes a receptacle opening that faces a direction opposite the first connector receptacle openings.

17. A patch panel assembly for use in a data network, the data network including a plurality of work area outlets adapted to be connected with individual end-user devices, the data network including network devices operatively connected to the patch panel, the network devices receiving status information about the work area outlets, the patch panel being operatively connected to the work area outlets by way of network cables, one network cable being associated with one work area outlet, the patch panel assembly comprising:

a first circuit board having first and second opposing surfaces, the first circuit board including a plurality of first connectors disposed thereon, the first connectors being adapted to connect to the network cables;

a second circuit board having first and second opposing surfaces, the second circuit board being spaced away from the first circuit board, the second circuit board including a plurality of indicators disposed thereon for selectively indicating at least one of the first connectors, the first and second circuit boards cooperatively defining a hollow nest therebetween;

first integrated circuits disposed on the first circuit board within the hollow nest, the first integrated circuits being operatively connected to the first connectors by first circuitry also disposed on the first circuit board within the hollow nest, the first integrated circuits being adapted to monitor status information of the work area outlets; and second integrated circuits disposed on the second circuit board within the hollow nest, the second integrated circuits being operatively connected to the indicators by second circuitry also disposed on the second circuit board, the second integrated circuits selectively operating the indicators in response to status information obtained from the first integrated circuits.

18. The patch panel assembly of claim 17, wherein the first and second integrated circuits are disposed on opposing surfaces of the hollow nest.

19. The patch panel assembly of claim 18, wherein the first and second circuitry are connected together by a connector extending between the first and second circuit boards within the hollow nest.

20. The patch panel assembly of claim 17, further including at least one second connector disposed on the second circuit board and extending through the hollow nest to a rear surface of the first circuit board.

* * * * *